United States Patent
Lea et al.

(10) Patent No.: US 11,010,085 B2
(45) Date of Patent: *May 18, 2021

(54) APPARATUSES AND METHODS FOR DATA MOVEMENT

(71) Applicant: Micron Technology, Inc., Boise, ID (US)

(72) Inventors: Perry V. Lea, Eagle, ID (US); Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/506,664

(22) Filed: Jul. 9, 2019

(65) Prior Publication Data
US 2019/0332310 A1 Oct. 31, 2019

Related U.S. Application Data

(63) Continuation of application No. 15/978,750, filed on May 14, 2018, now Pat. No. 10,353,618, which is a
(Continued)

(51) Int. Cl.
*G06F 3/06* (2006.01)
*G11C 7/10* (2006.01)
(Continued)

(52) U.S. Cl.
CPC .......... *G06F 3/0647* (2013.01); *G06F 3/061* (2013.01); *G06F 3/0625* (2013.01);
(Continued)

(58) Field of Classification Search
CPC ...... G06F 3/0647; G06F 3/061; G06F 3/0625; G06F 3/0685; G11C 7/1072
See application file for complete search history.

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
EP 0214718 3/1987
(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
(Continued)

*Primary Examiner* — Edward J Dudek, Jr.
(74) *Attorney, Agent, or Firm* — Brooks, Cameron & Huebsch, PLLC

(57) ABSTRACT

The present disclosure includes apparatuses and methods for data movement. An example apparatus includes a memory device that includes a plurality of subarrays of memory cells and sensing circuitry coupled to the plurality of subarrays. The sensing circuitry includes a sense amplifier and a compute component. The memory device also includes a plurality of subarray controllers. Each subarray controller of the plurality of subarray controllers is coupled to a respective subarray of the plurality of subarrays and is configured to direct performance of an operation with respect to data stored in the respective subarray of the plurality of subarrays. The memory device is configured to move a data value corresponding to a result of an operation with respect to data stored in a first subarray of the plurality of subarrays to a memory cell in a second subarray of the plurality of subarrays.

20 Claims, 8 Drawing Sheets

Related U.S. Application Data continuation of application No. 15/045,750, filed on Feb. 17, 2016, now Pat. No. 9,971,541.

(51) Int. Cl.
  *G11C 11/4076* (2006.01)
  *G11C 11/4091* (2006.01)
  *G11C 11/4097* (2006.01)

(52) U.S. Cl.
  CPC .......... *G06F 3/0685* (2013.01); *G11C 7/1006* (2013.01); *G11C 7/1072* (2013.01); *G11C 11/4076* (2013.01); *G11C 11/4091* (2013.01); *G11C 11/4097* (2013.01); *G11C 2207/2236* (2013.01); *G11C 2207/2245* (2013.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,748,551 A | 5/1998 | Ryan et al. |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,175,535 B1 | 1/2001 | Dhong et al. |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,114,014 B2 | 9/2006 | Yatziv et al. |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shinano et al. |
| 8,279,683 B2 | 10/2012 | Klein |
| 8,310,884 B2 | 11/2012 | Iwai et al. |
| 8,332,367 B2 | 12/2012 | Bhattacherjee et al. |

(56) References Cited

U.S. PATENT DOCUMENTS

| | | |
|---|---|---|
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,473,669 B2 | 6/2013 | Sinclair |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,971,541 B2 * | 5/2018 | Lea ................. G11C 7/1072 |
| 10,353,618 B2 * | 7/2019 | Lea ................. G11C 11/4097 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2001/0053105 A1 | 12/2001 | Elliott et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0118721 A1 | 5/2007 | Stewart et al. |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0012717 A1 | 1/2015 | Murphy |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0085589 A1 | 3/2015 | Lu et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |

(56) References Cited

U.S. PATENT DOCUMENTS

2015/0357047 A1 12/2015 Tiwari
2016/0306567 A1 10/2016 Yang

FOREIGN PATENT DOCUMENTS

| EP | 2026209 | 2/2009 |
|---|---|---|
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9.3 Minloc and Maxloc", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.

Draper, et al, "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for related PCT Application No. PCT/US2017/017613, dated May 31, 2017, 16 pages.

Singh, Nisha, "Differences between Single and Multiprocessor Systems", Jan. 4, 2015, (2 pgs.), All Around Experts, retrieved from: http://allroundexpert.blogspot.com/2015/01/difference-between-single-and_29.html.

\* cited by examiner

APPARATUSES AND METHODS FOR DATA MOVEMENT

PRIORITY INFORMATION

This application is a Continuation of U.S. application Ser. No. 15/978,750, filed May 14, 2018, which is a Continuation of U.S. application Ser. No. 15/045,750, filed Feb. 17, 2016, which issued as U.S. Pat. No. 9,971,541 on May 15, 2018, the contents of which are included herein by reference.

TECHNICAL FIELD

The present disclosure relates generally to semiconductor memory and methods, and more particularly, to apparatuses and methods for data movement.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (PRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing operations, such as AND, OR, NOT, NAND, NOR, and XOR, and invert (e.g., inversion) operations on data (e.g., one or more operands). For example, functional unit circuitry may be used to perform arithmetic operations, such as addition, subtraction, multiplication, and division, on operands via a number of operations.

A number of components in an electronic system may be involved in providing instructions to the functional unit circuitry for execution. The instructions may be executed, for instance, by a processing resource such as a controller and host processor. Data (e.g., the operands on which the instructions will be executed) may be stored in a memory array that is accessible by the functional unit circuitry. The instructions and data may be retrieved from the memory array and sequenced and buffered before the functional unit circuitry begins to execute instructions on the data. Furthermore, as different types of operations may be performed in one or multiple clock cycles through the functional unit circuitry, intermediate results of the instructions and data may also be sequenced and buffered.

In many instances, the processing resources (e.g., processor and associated functional unit circuitry) may be external to the memory array, and data is accessed via a bus between the processing resources and the memory array to execute a set of instructions. Processing performance may be improved in a processing-in-memory device, in which a processor may be implemented internal and near to a memory (e.g., directly on a same chip as the memory array). A processing-in-memory device may save time by reducing and eliminating external communications and may also conserve power. However, data movement between and within banks of a processing-in-memory device may influence the data processing time of the processing-in-memory device.

DETAILED DESCRIPTION

Figure 1A:
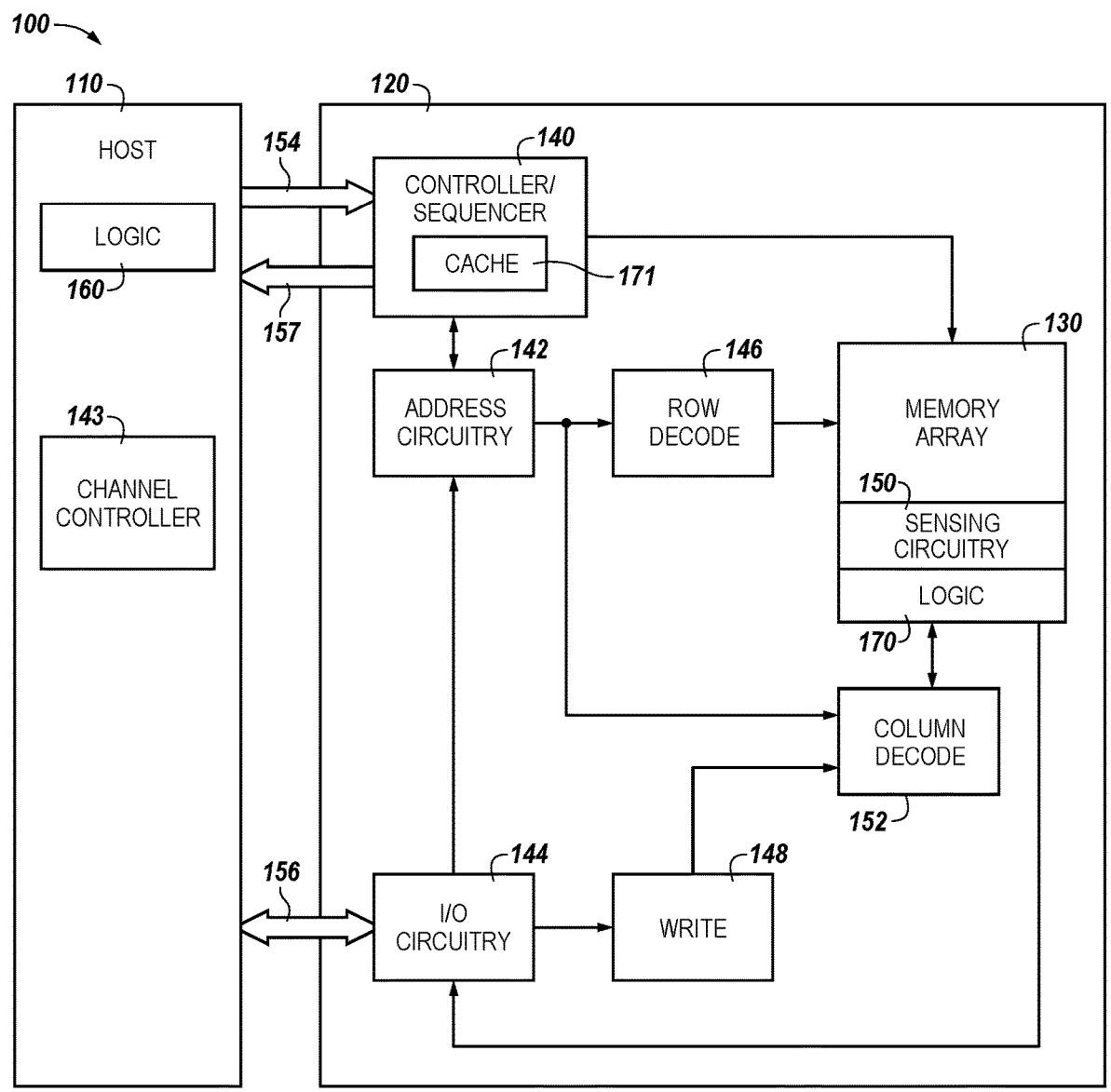
FIG. 1A is a block diagram of an apparatus in the form of a computing system including a memory device in accordance with a number of embodiments of the present disclosure.

The present disclosure includes apparatuses and methods for data movement (e.g., for processing-in-memory (PIM) structures). In at least one embodiment, the apparatus includes a memory device configured to include a plurality of subarrays of memory cells and sensing circuitry coupled to the plurality of subarrays (e.g., via a plurality of columns of the memory cells). The sensing circuitry includes a sense amplifier and a compute component (e.g., coupled to each of the plurality of columns). The memory device includes a plurality of subarray controllers. Each subarray controller of the plurality of subarray controllers is coupled to a respective subarray of the plurality of subarrays and is configured to direct performance of an operation (e.g., a single operation) with respect to data stored in the respective subarray of the plurality of subarrays. For example, the data on which the operation is performed can be stored in a subset of or all of the memory cells in the respective subarray of the plurality of subarrays.

The memory device is configured to move a data value corresponding to a result of an operation with respect to data stored in a first subarray of the plurality of subarrays to a memory cell in a second subarray of the plurality of subarrays. For example, a first operation can be performed with respect to data stored in the first subarray and a second operation can be performed with respect to data moved to the second subarray, where the second operation can be different than the first operation.

Most data should vary between different banks and subarrays within a PIM structure (e.g., PIM DRAM implementation). As described in more detail below, the embodiments can allow a host system to allocate a number of locations (e.g., sub-arrays (or "subarrays")) and portions of subarrays, in one or more DRAM banks to hold (e.g., store) and/or process data. A host system and a controller may perform the address resolution on entire, or portions of, blocks of program instructions (e.g., PIM command instructions) and data and direct (e.g., control) allocation, storage, and/or flow of data and commands into allocated locations (e.g., subarrays and portions of subarrays) within a destination (e.g., target) bank. Writing data and executing commands (e.g., performing a sequence of operations, as described herein) may utilize a normal DRAM write path to the DRAM device. As the reader will appreciate, while a DRAM-style PIM device is discussed with regard to examples presented herein, embodiments are not limited to a PIM DRAM implementation.

As described herein, a bit-parallel single instruction multiple data (SIMD) functionality can be modified to operate as a systolic array with an ability to perform multiple instruction multiple data (MIMD) operations. For example, when 64 subarrays are used to perform an operation with 64 logical steps, implantation of such an architectural modification may yield around a 64-fold increase in performance (e.g., by performing the operation in around 1/64th of the time) for some applications of the PIM device.

The architecture can use a subarray controller (e.g., a sequencer, a state machine, a microcontroller, a sub-processor, ALU circuitry, or some other type of controller) to execute a set of instructions to perform an operation (e.g., a single operation) on data (e.g., one or more operands). As used herein, an operation can be, for example, a Boolean operation, such as AND, OR, NOT, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of logical operations.

Each subarray controller may be coupled to a respective subarray to stage and control the processing performed on data stored in that subarray (e.g., which may be just a subset of all the data stored in that subarray). For example, each memory cell in each subarray can be involved in performance of a single operation (also referred to as an "atomic operation") that can be the same as (e.g., identical to) the operation performed on data stored in the other memory cells in the same subarray. This can provide processing and/or power consumption benefits.

Multiple unique operations in a sequence of instructions may be performed with a streaming interface. The streaming interface may be a shared I/O line, as described herein, (also referred to as a data flow pipeline) between the memory cells. Such a data flow pipeline can allow a single operation to be performed with respect to data stored in one subarray, with a data value corresponding to the result of that operation being moved (e.g., transferred, transported, and/or fed) by the data flow pipeline (e.g., via a shared I/O line) into a selected row of another (e.g., adjacent) subarray. The memory device may be configured to perform a next single operation on data stored in the other subarray that, in various embodiments, may be a same or a different operation. This process can be repeated until the sequence of instructions is completed to yield an intended result.

According to one or more embodiments, there may be one subarray controller per subarray. In some embodiments, a bank of a memory device can have 64 subarrays. Thus, the bank might have 64 subarray controllers. Each subarray controller can be configured to perform a uniquely defined operation. The memory device can be configured to move the result of its one operation to a particular row of another subarray. Different operations may be performed on data stored in each subarray based upon the instructions executed by their respective subarray controllers. Because operational cycles may include operations that take longer to perform than one clock cycle of the computing device, an operational cycle may, in some embodiments, last more than one clock cycle.

As used herein, a batch is intended to mean a unit of data values that accumulates in an input data cache, as described herein, as unprocessed data until input to a first subarray for processing. The batch of unprocessed data may be input to the first subarray, for example, when the data values of the batch are substantially equal to the number of memory cells of the first subarray (e.g., in at least one row of the subarray). A first batch of data values input to the first subarray can be referred to as the first batch until output as completely processed data values after performance of a last operation in a sequence of operations. Similarly, after the first batch of data has been moved (e.g., transferred and/or copied) to another subarray, a second batch of data values can be input to the first subarray and can be referred to as the second batch until output as completely processed data values, and so on.

As used herein, systolic is intended to mean data that is input to flow through a network of hard-wired processor nodes (e.g., memory cells in subarrays, as described herein) to combine, process, merge, and/or sort the data into a derived end result. Each node can independently compute a partial result, store the partial result within itself, and move (e.g., transfer and/or copy) the partial result downstream for further processing of the partial result until computation and output of the derived end result. Systolic arrays may be referred to as MIMD architectures.

When a first batch of unprocessed data that has been input into a first subarray in a sequence of, for example, 64 subarrays has been processed and moved (e.g., transferred and/or copied) to another (e.g., a second) subarray for systolic processing, a second batch of unprocessed data can be input into the first subarray, followed by a third batch when the second batch has been moved (e.g., transferred and/or copied) to the second subarray and the first batch has been moved (e.g., transferred and/or copied) to a third subarray, and so on. Latency, as described herein, is intended to mean a period of time between input of a first batch of unprocessed data to a first subarray for performance of a first operation and output of the first batch as completely processed data. For example, when a sequence of 64 instructions has been executed and the processed data has been output after the 64th operational cycle (e.g., after performing a 64th operation in the sequence of 64 operations), the latency of output from the sequence of 64 subarrays has expired. As such, because additional batches of data can be input after every operational cycle, every operational cycle of the memory device following the latency can output a completely processed batch of data or, in some embodiments described herein, more than one completely processed batch of data.

Many applications may involve input of a lengthy and/or continuous stream of data for data processing. Such applications can, for example, include signal processing, image processing, speech recognition, packet inspection, comma separated value (CSV) parsing, matrix multiplication, and neural nets, among other applications, that may operate on a lengthy and/or continuous stream of data. In some embodiments, this unprocessed data may be input into a figurative top of an array that is configured as a stack of subarrays and the data processed by execution of a sequence of instructions in consecutive subarrays, and the result may be output at the bottom of the stack of subarrays.

The apparatuses and methods for data movement described herein include a number of changes to operation of a controller of, for example, a PIM DRAM implementation. For example, the controller can coordinate assignment of instructions for separate operations of a sequence of operations to each subarray controller, as described herein, such that each subarray controller performs a separate operation with respect to data stored in each of the subarrays. For example, for a stack of 64 subarrays, 64 independent operations can be performed to complete the sequence of operations.

The subarray controller coupled to each subarray can be configured to direct (e.g., by execution of instructions) moving (e.g., transferring and/or copying) a result of performance of the operation from sensing circuitry, as described herein, to a row (e.g., a memory cell in the row) in another (e.g., adjacent) subarray. For example, each performance of the operation can be followed by moving (e.g., transferring and/or copying) the resultant processed data value from the sensing circuitry of each subarray to a row in another subarray for performance of the next operation in the sequence of operations (e.g., a systolic sequence). A subarray controller configured to perform an operation at a beginning of a sequence can be coupled to an input data cache to sense the presence of new data therein and to initiate the sequence of operations based thereon.

An advantage of the systolic data movement described herein can include that a PIM DRAM memory device may effectively make use of its massive parallelization and computational power. For example, a PIM DRAM memory device may extend its computation and execution capabilities in order to substantially simultaneously perform multiple, independent, and/or unique operations in a sequence of operations while outputting the processed data values in parallel from one operation to the next. Accordingly, for example, for a stack of 64 subarrays, 64 independent operations can be performed to effectively increase the performance (e.g., speed, rate, and/or efficiency) of data movement in a PIM array by 64-fold.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of commands and data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and eliminated so as to provide a number of additional embodiments of the present disclosure. In addition, the proportion and the relative scale of the elements provided in the figures are intended to illustrate certain embodiments of the present disclosure and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, channel controller 143, memory array 130, sensing circuitry 150, including sensing amplifiers and compute components, and peripheral sense amplifier and logic 170 might each also be separately considered an "apparatus."

In previous approaches, data may be transferred from the array and sensing circuitry (e.g., via a bus comprising input/output (I/O) lines) to a processing resource such as a processor, microprocessor, and compute engine, which may comprise ALU circuitry and other functional unit circuitry configured to perform the appropriate operations. However, transferring data from a memory array and sensing circuitry to such processing resource(s) may involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local and global I/O lines), moving the data to the array periphery, and providing the data to the compute function.

Furthermore, the circuitry of the processing resource(s) (e.g., a compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and memory density, for example.

A number of embodiments of the present disclosure include sensing circuitry formed on pitch with an array of memory cells. The sensing circuitry is capable of performing data sensing and compute functions and storage (e.g., caching) of data local to the array of memory cells.

In order to appreciate the improved data movement techniques described herein, a discussion of an apparatus for implementing such techniques (e.g., a memory device having PIM capabilities and an associated host) follows. According to various embodiments, program instructions (e.g., PIM commands) involving a memory device having PIM capabilities can distribute implementation of the PIM commands and data over multiple sensing circuitries that can implement operations and can move and store the PIM commands and data within the memory array (e.g., without having to transfer such back and forth over an A/C and data bus between a host and the memory device). Thus, data for a memory device having PIM capabilities can be accessed and used in less time and using less power. For example, a time and power advantage can be realized by increasing the speed, rate, and/or efficiency of data being moved around and stored in a computing system in order to process requested memory array operations (e.g., reads, writes, logical operations, etc.).

The system 100 illustrated in FIG. 1A can include a host 110 coupled (e.g., connected) to memory device 120, which includes the memory array 130. Host 110 can be a host system such as a personal laptop computer, a desktop computer, a tablet computer, a digital camera, a smart phone, or a memory card reader, among various other types of hosts. Host 110 can include a system motherboard and backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and a high performance computing (HPC) system and a portion thereof. Although the example shown in FIG. 1A illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, description of the system 100 has been simplified to focus on features with particular relevance to the present disclosure. For example, in various embodiments, the memory array 130 can be a DRAM array, SRAM array, STT RAM array, PCRAM array, TRAM array, RRAM array, NAND flash array, and NOR flash array, for instance. The memory array 130 can include memory cells arranged in rows coupled by access lines (which may be referred to herein as word lines or select lines) and columns coupled by sense lines (which may be referred to herein as data lines or digit lines). Although a single memory array 130 is shown in FIG. 1A, embodiments are not so limited. For instance, memory device 120 may include a number of memory arrays 130 (e.g., a number of banks of DRAM cells, NAND flash cells, etc.) in addition to a number subarrays, as described herein.

The memory device 120 can include address circuitry 142 to latch address signals provided over a data bus 156 (e.g., an I/O bus from the host 110) by I/O circuitry 144 (e.g., provided to external ALU circuitry and to DRAM DQs via local I/O lines and global I/O lines). Status and exception information can be provided from the controller 140 on the memory device 120 to a channel controller 143, for example, through a high speed interface (HSI) out-of-band bus 157, which in turn can be provided from the channel controller 143 to the host 110. The channel controller 143 can include a logic component 160 to allocate a plurality of locations (e.g., controllers for subarrays) in the arrays of each respective bank to store bank commands, application instructions (e.g., as sequences of operations), and arguments (PIM commands) for the various banks associated with operation of each of a plurality of memory devices (e.g., 120-0, 120-1, . . . , 120-N). The channel controller 143 can dispatch commands (e.g., PIM commands) to the plurality of memory devices 120-1, . . . , 120-N to store those program instructions within a given bank of a memory device.

Address signals are received through address circuitry 142 and decoded by a row decoder 146 and a column decoder 152 to access the memory array 130. Data can be sensed (read) from memory array 130 by sensing voltage and current changes on sense lines (digit lines) using a number of sense amplifiers, as described herein, of the sensing circuitry 150. A sense amplifier can read and latch a page (e.g., a row) of data from the memory array 130. Additional compute components, as described herein, can be coupled to the sense amplifiers and can be used in combination with the sense amplifiers to sense, store (e.g., cache and buffer), perform compute functions (e.g., operations), and/or move data. The I/O circuitry 144 can be used for bi-directional data communication with host 110 over the data bus 156 (e.g., a 64 bit wide data bus). The write circuitry 148 can be used to write data to the memory array 130.

Controller 140 (e.g., bank control logic and sequencer) can decode signals (e.g., commands) provided by control bus 154 from the host 110. These signals can include chip enable signals, write enable signals, and address latch signals that can be used to control operations performed on the memory array 130, including data sense, data store, data move, data write, and data erase operations, among other operations. In various embodiments, the controller 140 can be responsible for executing instructions from the host 110 and accessing the memory array 130. The controller 140 can be a state machine, a sequencer, or some other type of controller. The controller 140 can control shifting data (e.g., right or left) in a row of an array (e.g., memory array 130).

Examples of the sensing circuitry 150 are described further below (e.g., in FIGS. 2 and 3). For instance, in a number of embodiments, the sensing circuitry 150 can include a number of sense amplifiers and a number of compute components, which may serve as an accumulator and can be used to perform operations as directed by the subarray controller of each subarray (e.g., on data associated with complementary sense lines).

In a number of embodiments, the sensing circuitry 150 can be used to perform operations using data stored in memory array 130 as inputs and participate in movement of the data for writing, logic, and storage operations to a different location in the memory array 130 without transferring the data via a sense line address access (e.g., without firing a column decode signal). As such, various compute functions can be performed using, and within, sensing circuitry 150 rather than (or in association with) being performed by processing resources external to the sensing circuitry 150 (e.g., by a processor associated with host 110 and other processing circuitry, such as ALU circuitry, located on device 120, such as on controller 140 or elsewhere).

In various previous approaches, data associated with an operand, for instance, would be read from memory via sensing circuitry and provided to external ALU circuitry via I/O lines (e.g., via local I/O lines and global I/O lines). The external ALU circuitry could include a number of registers and would perform compute functions using the operands, and the result would be transferred back to the array via the I/O lines.

In contrast, in a number of embodiments of the present disclosure, the sensing circuitry 150 is configured to perform operations on data stored in memory array 130 and store the result back to the memory array 130 without enabling a local I/O line and global I/O line coupled to the sensing circuitry 150. The sensing circuitry 150 can be formed on pitch with the memory cells of the array. Additional peripheral sense amplifiers and/or logic 170 (e.g., the subarray controllers that each store instructions for performance of an operation) can be coupled to the sensing circuitry 150. The sensing circuitry 150 and the peripheral sense amplifier and logic 170 can cooperate in performing operations, according to some embodiments described herein.

As such, in a number of embodiments, circuitry external to memory array 130 and sensing circuitry 150 is not needed to perform compute functions as the sensing circuitry 150 can perform the appropriate operations in order to perform such compute functions by execution of a set (e.g., a sequence) of instructions without the use of an external processing resource. Therefore, the sensing circuitry 150 may be used to complement or to replace, at least to some extent, such an external processing resource (or at least lessen the bandwidth consumption of such an external processing resource).

In a number of embodiments, the sensing circuitry 150 may be used to perform operations (e.g., to execute the set of instructions) in addition to operations performed by an external processing resource (e.g., host 110). For instance, either of the host 110 and the sensing circuitry 150 may be limited to performing only certain operations and a certain number of operations.

Enabling a local I/O line and global I/O line can include enabling (e.g., activating, turning on) a transistor having a gate coupled to a decode signal (e.g., a column decode signal) and a source/drain coupled to the I/O line. However, embodiments are not limited to not enabling a local I/O line and global I/O line. For instance, in a number of embodiments, the sensing circuitry 150 can be used to perform operations without enabling column decode lines of the array. However, the local I/O line(s) and global I/O line(s) may be enabled in order to transfer a result to a suitable location other than back to the memory array 130 (e.g., to an external register).

Figure 1B:
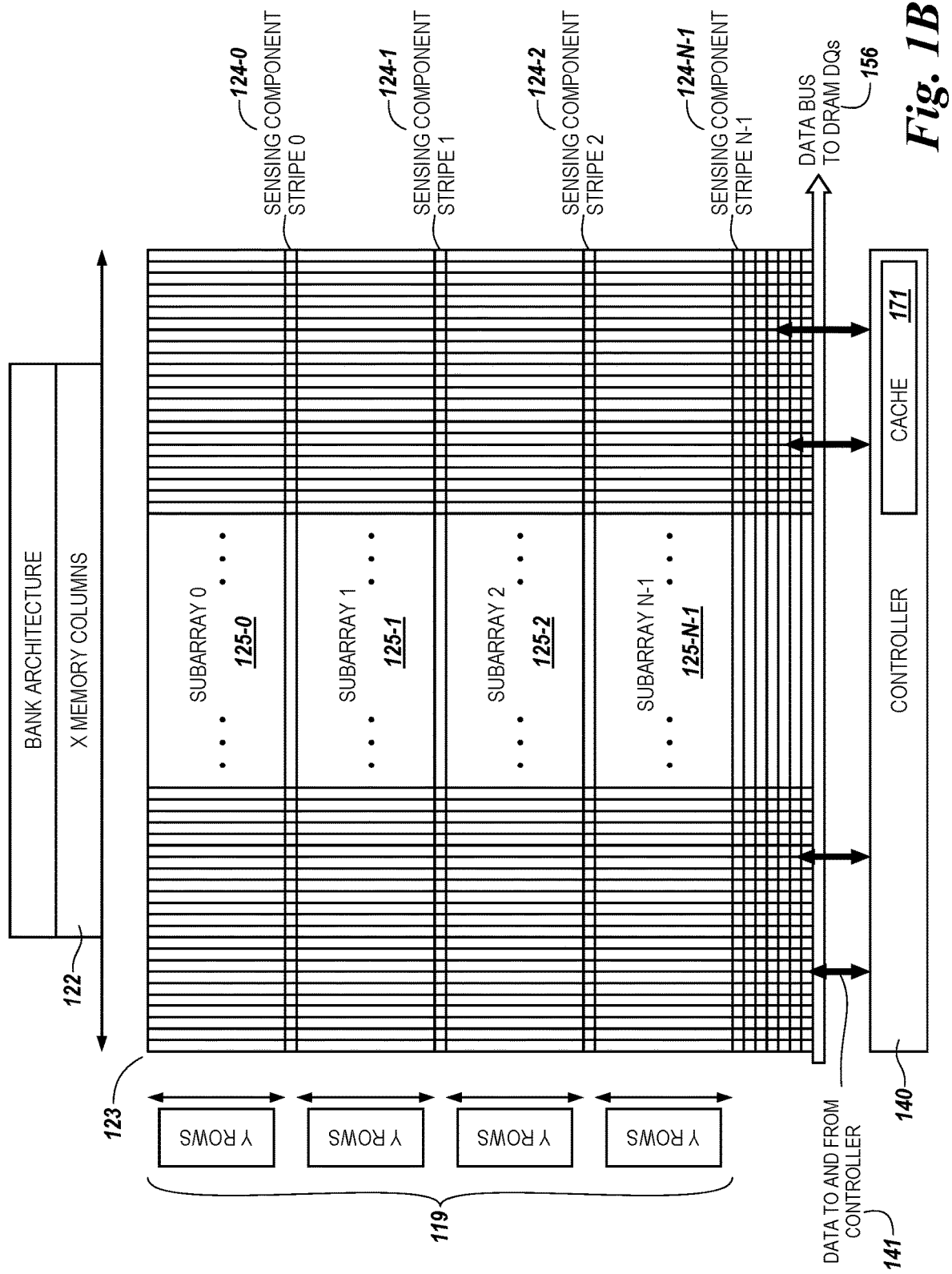
FIG. 1B is a block diagram of a bank section of a memory device in accordance with a number of embodiments of the present disclosure.

FIG. 1B is a block diagram of a bank section 123 of a memory device in accordance with a number of embodiments of the present disclosure. For example, bank section 123 can represent an example section of a number of bank sections of a bank of a memory device (e.g., bank section 0, bank section 1, . . . , bank section M). As shown in FIG. 1B, a bank architecture can include a plurality of memory columns 122 shown horizontally as X (e.g., 16,384 columns in an example DRAM bank and bank section). Additionally, the bank section 123 may be divided into subarray 0, subarray 1, . . . , and subarray N-1 (e.g., 32, 64, or 128 subarrays, among other subarray configurations) shown at 125-0, 125-1, . . . , 125-N-1, respectively, that are separated by amplification regions configured to be coupled to a data path (e.g., the shared I/O line described herein). As such, the subarrays 125-0, 125-1, . . . , 125-N-1 can each have amplification regions shown at 124-0, 124-1, . . . , 124-N-1 that correspond to sensing component stripe 0, sensing component stripe 1, . . . , and sensing component stripe N-1, respectively.

Each column 122 can be configured to be coupled to sensing circuitry 150, as described in connection with FIG. 1A and elsewhere herein. As such, each column in a subarray can be coupled individually to a sense amplifier and/or compute component that contribute to a sensing component stripe for that subarray. For example, as shown in FIG. 1B, the bank architecture can include sensing component stripe 0, sensing component stripe 1, . . . , sensing component stripe N-1 that each have sensing circuitry 150 with sense amplifiers and compute components that can, in various embodiments, be used as registers, caches, etc., and for computations, data buffering, etc. The sensing component stripes can, in some embodiments, be coupled to each column 122 in the respective subarrays 125-0, 125-1, . . . , 125-N-1. The compute component within the sensing circuitry 150 coupled to the memory array 130, as shown in FIG. 1A, can complement a cache 171 associated with the controller 140.

Each of the of the subarrays 125-0, 125-1, . . . , 125-N-1 can include a plurality of rows 119 shown vertically as Y (e.g., each subarray may include 512 rows in an example DRAM bank). Example embodiments are not limited to the example horizontal and vertical orientation of columns and rows described herein or the example numbers thereof.

As shown in FIG. 1B, the bank architecture can be associated with controller 140. The controller 140 shown in FIG. 1B can, in various examples, represent at least a portion of the functionality embodied by and contained in the controller 140 shown in FIG. 1A. The controller 140 can direct (e.g., control) input of commands and data 141 to the bank architecture and output from the bank architecture (e.g., to the host 110) along with control of data movement (e.g., systolic data movement) in the bank architecture, as described herein. The bank architecture can include a data bus 156 (e.g., a 64 bit wide data bus) to DRAM DQs, which can correspond to the data bus 156 described in connection with FIG. 1A.

Figure 1C:
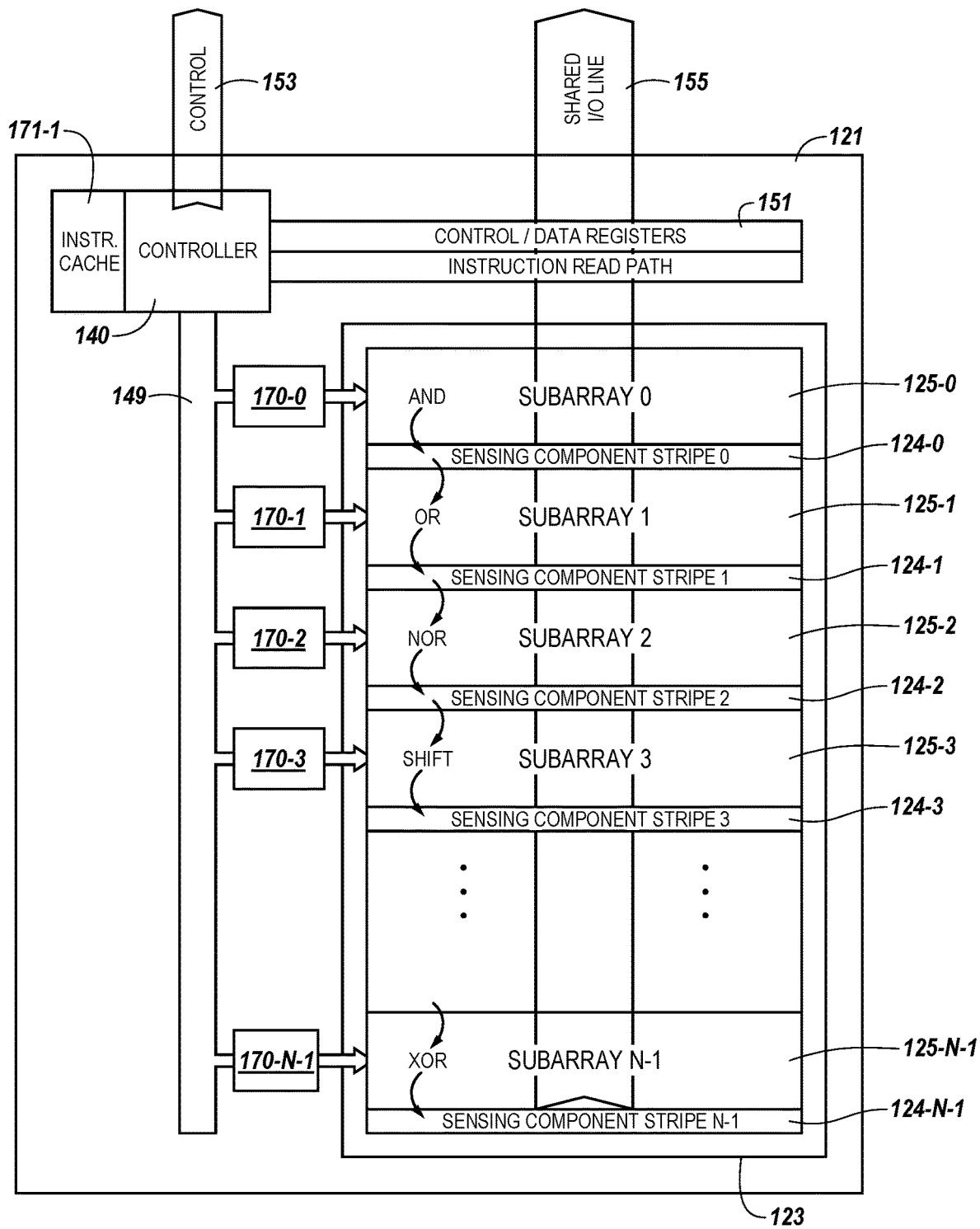
FIG. 1C is a block diagram of a bank of a memory device in accordance with a number of embodiments of the present disclosure.

FIG. 1C is a block diagram of a bank 121 of a memory device 120 in accordance with a number of embodiments of the present disclosure. For example, bank 121 can represent an example bank to a memory device (e.g., bank 0, bank 1, . . . , bank M-1). As shown in FIG. 1C, a bank architecture can include an address/control (A/C) path 153 (e.g., a bus) coupled to a controller 140. Again, the controller 140 shown in FIG. 1C can, in various examples, represent at least a portion of the functionality embodied by and contained in the controller 140 shown in FIGS. 1A and 1B.

As shown in FIG. 1C, a bank 121 can include a plurality of bank sections (e.g., bank section 123). As further shown in FIG. 1C, a bank section 123 can be subdivided into a plurality of subarrays (e.g., subarray 0, subarray 1, . . . , subarray N-1 shown at 125-0, 125-1, . . . , 125-N-1) respectively separated by sensing component stripes 124-0, 124-1, . . . , 124-N-1, as shown in FIG. 1B. The sensing component stripes can include sensing circuitry 150 and/or can be coupled to logic circuitry 170, as shown in FIG. 1A and described further with regard to subarray controllers in connection with FIG. 1C through FIG. 5.

As shown schematically in FIG. 1C, an architecture of a bank 121 and each section 123 of the bank can include a plurality of shared I/O lines 155 (e.g., data path, bus) configured to couple to the plurality of subarrays 125-0, 125-1, . . . , 125-N-1 of memory cells of the bank section 123 and a plurality of banks (not shown). The plurality of shared I/O lines 155 can be selectably coupled between subarrays, rows, and particular columns of memory cells via the sensing component stripes represented by 124-0, 124-1, ..., 124-N-1 shown in FIG. 1B. As noted, the sensing component stripes 124-0, 124-1, ..., 124-N-1 each include sensing circuitry 150 with sense amplifiers and compute components configured to couple to each column of memory cells in each subarray, as shown in FIG. 1A and described further in connection with FIGS. 2-5.

The plurality of shared I/O lines 155 can be utilized to increase a speed, rate, and/or efficiency of data movement in a PIM array (e.g., between subarrays). In at least one embodiment, using the plurality of shared I/O lines 155 provides an improved data path by providing at least a thousand bit width. In one embodiment, 2048 shared I/O lines are coupled to 16,384 columns to provide a 2048 bit width. The illustrated plurality of shared I/O lines 155 can be formed on pitch with the memory cells of the array.

As described herein, an I/O line can be selectably shared by a plurality of subarrays, rows, and particular columns of memory cells via the sensing component stripe coupled to each of the subarrays. For example, the sense amplifier and/or compute component of each of a selectable subset of a number of columns (e.g., eight column subsets of a total number of columns) can be selectably coupled to each of the plurality of shared I/O lines for data values stored (cached) in the sensing component stripe to be moved (e.g., transferred, transported, and/or fed) to each of the plurality of shared I/O lines. Because the singular forms "a", "an", and "the" can include both singular and plural referents herein, "a shared I/O line" can be used to refer to "a plurality of shared I/O lines", unless the context clearly dictates otherwise. Moreover, "shared I/O lines" is an abbreviation of "plurality of shared I/O lines".

In some embodiments, the controller 140 may be configured to provide instructions (commands) and data to a plurality of locations of a particular bank 121 in the memory array 130 and to the sensing component stripes 124-0, 124-1, ..., 124-N-1 via the plurality of shared I/O lines 155 coupled to control and data registers 151. For example, the control and data registers 151 can provide instructions to be executed using by the sense amplifiers and the compute components of the sensing circuitry 150 in the sensing component stripes 124-0, 124-1, ..., 124-N-1. FIG. 1C illustrates an instruction cache 171-1 associated with the controller 140 and coupled to a write path 149 to each of the subarrays 125-0, 125-1, ..., 125-N-1 in the bank 121. In various embodiments, the instruction cache 171-1 can be the same cache or can be associated with an input data cache configured to receive data from the host and signal to the controller that the data is received to initiate performance of a stored sequence of a plurality of operations.

The instruction cache 171-1 can be used to receive and store a sequence of instructions for operations to be performed with respect to data stored in the memory cells of the subarrays (e.g., received from the logic component 160 described in connection with FIG. 1A). The write path 149 can be used to allocate the instructions for performance of each operation by a different subarray controller 170-0, 170-1, ..., 170-N-1 that is each individually coupled to a different subarray 125-0, 125-1, ..., 125-N-1 of memory cells and the associated sensing component stripes 124-0, 124-1, ..., 124-N-1. The sets of instructions for the operations performed by the subarray controllers 170-0, 170-1, ..., 170-N-1 can form at least a portion of the logic 170 described in connection with FIG. 1A.

The subarray controllers 170-0, 170-1, ..., 170-N-1 can be configured to direct performance of operations (e.g., a single operation per subarray controller) upon data in a plurality of memory cells in each subarray 125-0, 125-1, ..., 125-N-1 by the sensing circuitry. For example, each of the subarray controllers 170-0, 170-1, ..., 170-N-1 can, in some embodiments, store a set of instructions for performance of a single operation. Whether the operation is actually performed is dependent upon the data processing implementation selected by the host 110 and/or the controller 140 (e.g., whether the operation is part of a sequence of instructions selected for particular incoming data). In various embodiments, the sensing circuitry associated with columns of each of the memory cells or a subset of the memory cells in a particular subarray can be directed by the coupled subarray controller to perform the operation stored in the coupled subarray controller upon data stored in those memory cells. For example, depending upon the rate and/or volume of unprocessed data input, a subset of the rows and/or columns of a sequence of subarrays may be used for processing the data. The subset of the rows and/or columns may be in corresponding or different locations in each of the sequence of subarrays.

Instructions can be executed by the subarray controllers 170-0, 170-1, ..., 170-N-1 for performance or operations in sequence with respect to the data stored in the subarrays 125-0, 125-1, ..., 125-N-1, as shown in FIG. 1C. As an example, an operation performed upon data stored in memory cells in subarray 0 (125-0) may be an AND operation. The AND operation can be performed by sensing circuitry 150 in sensing component stripe 0 (124-0) upon the data values.

Controller 140 can control movement of the data values upon which the operation has been performed to particular memory cells in subarray 1 (125-1), for example. Data values can, as described herein, be moved (e.g., transferred and/or transported) from a coupled sensing component stripe to a coupled shared I/O line. In subarray 1 (125-1), an OR operation may be performed as a second operation in the sequence, etc. The data values upon which the OR operation has been performed can be moved (e.g., transferred and/or copied) from sensing component stripe 1 (124-1) to particular memory cells in subarray 2 (125-2) in which a NOR operation may be performed as a third operation in the sequence. The data values upon which the NOR operation has been performed can be moved (e.g., transferred and/or copied) from sensing component stripe 2 (124-2) to particular memory cells in subarray 3 (125-3) in which a SHIFT operation may be performed as a fourth operation in the sequence.

Figure 5:
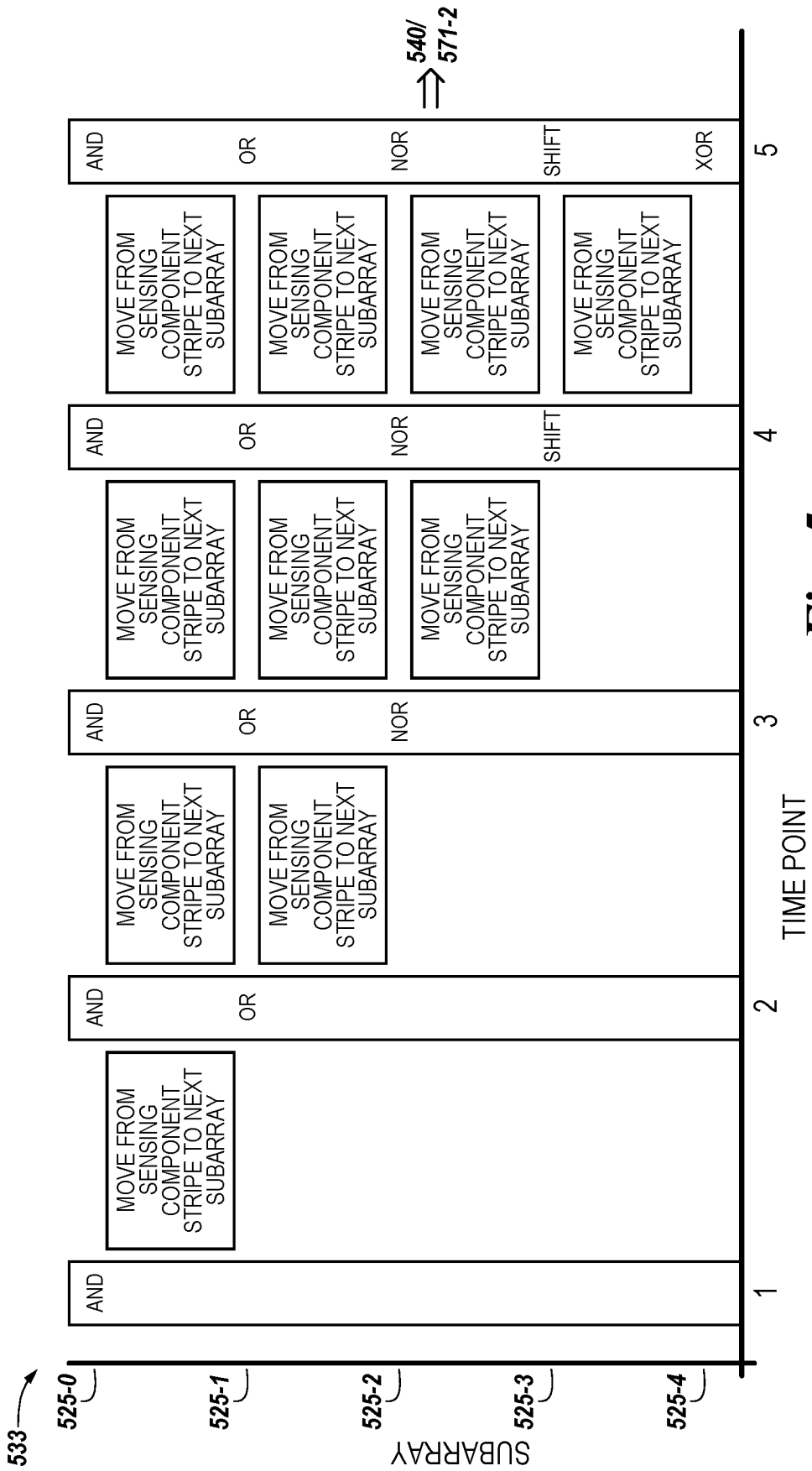
FIG. 5 illustrates a timing diagram associated with performing a number of data movement operations using circuitry in accordance with a number of embodiments of the present disclosure.

After the data values are sequentially moved (e.g., transferred and/or copied) through a number of intervening subarrays, the data values can reach a last subarray in the sequence for final processing of the data values. For example, in subarray N-1 (125-N-1) an XOR operation can been performed as the final processing of the data values, which then can be moved (e.g., transferred and/or copied) from sensing component stripe N-1 (124-N-1) for output 141 to, in some embodiments, a cache 571-2 associated with the controller 540 (e.g., as shown in FIG. 5).

The sequence of operations AND, OR, NOR, SHIFT, ..., XOR are presented by way of example as a subset of possible operations that are all different from each other, although embodiments of the present disclosure are not so limited. For example, any combination of operations usable in data processing can be implemented as described herein, with some of the operations possibly being repeated consecutively and/or at intervals throughout the sequence and/or some of the possible operations potentially not being used in the sequence.

In a bank section 123, which can include a particular number of subarrays 125-0, 125-1, . . . , 125-N-1 (e.g., 32, 64, 128 subarrays, among other subarray configurations), a number of subarray controllers and/or sets of instructions for operations can correspond to the number of subarrays. For example, for a bank section with 64 subarrays, a sequence of instructions can be executed to perform 64 operations by 64 separate subarray controllers, each individual subarray controller being coupled to a different subarray. However, embodiments are not so limited. For example, in some embodiments, an individual subarray controller can be configured to store a set of instructions such that the set of instructions can be executed to perform a single operation or a plurality of operations. The plurality of operations can be used for different operations selectably applied to data stored in the memory cells of the subarray in different operations (e.g., for operations performed at different times) and/or to be selectably applied to data stored in a number of subsets of the rows and/or columns of the subarrays (e.g., for different operations performed substantially simultaneously).

In some embodiments, any number of individual subarray controllers at any position in the bank section can be configured not to store instructions for an operation. For example, a bank section may have 64 subarrays, but a sequence of instructions may be executed to perform fewer operations, which can be stored in less than the 64 subarray controllers, such that some of the subarray controllers can be programmed to perform no operations. In some embodiments, the subarray controllers programmed to perform no operations can be positioned between subarray controllers that are programmed to perform operations (e.g., as a spacer).

When a first batch of unprocessed data has been input into subarray 0 (125-0) and the data values have been processed and moved (e.g., transferred and/or copied) to the next subarray 1 (125-1), a second batch of unprocessed data can be input into subarray 0 (125-0), followed by a third batch when the second batch input to subarray 0 (125-0) has been moved (e.g., transferred and/or copied) to subarray 1 (125-1) and the first batch has been moved (e.g., transferred and/or copied) to subarray 2 (125-2), and so on. When at least two different batches of unprocessed and/or partially processed are in at least two different subarrays of the bank section, the operation performed by the subarray controller of each subarray can be performed substantially simultaneously upon data stored in each selected memory cell of the at least two different subarrays.

For example, when the latency of a sequence of 64 subarrays has expired, a sequence of 64 instructions can have the 64 operations substantially simultaneously performed in each of the sequence of 64 subarrays. In sequences of instructions that are executed to perform fewer operations than the number of subarrays in the bank section, a plurality of sequences of such instructions (e.g., for different operations) can be executed in the subarrays of the same bank section. For example, in a bank section having 64 subarrays, four of the same and/or different sequences of 16 operations can be executed as sets of instructions in four 16 unit subsections of the 64 subarray controllers. Examples, however, are not so limited. For example, the number of operations to be performed by execution of the sequences of instructions and/or the number of sequences of instructions can be different such that each of the operations can be more or less than 16 and/or the total of the sequences of operations can be more or less than four as long as the total number of subarrays does not exceed 64.

From whichever subarray in the bank section (e.g., from particular rows and/or columns of memory cells in the subarray) performance of the operations is completed for the sequence of instructions, the processed data values can be output 141 to, in some embodiments, the cache 171-2 associated with the controller 140. As such, every operational cycle of the memory device, following the latency, can output more than one completely processed batch of data in those embodiments that have a plurality of sequences of instructions to be executed as operations in the subarray controllers coupled to a plurality of subarrays in a bank section. The controller 140, for example, can be configured to disregard null data output during the latency period and/or null data that otherwise is not output as a result of processing input of unprocessed data, as described herein.

Implementations of PIM DRAM architecture may perform processing at the sense amplifier and compute component level. Implementations of PIM DRAM architecture may allow only a finite number of memory cells to be connected to each sense amplifier (e.g., around 512 memory cells in some embodiments). A sensing component stripe 124 may include, for example, from around 8,000 to around 16,000 sense amplifiers. A sensing component stripe 124 may be configured to couple to an array of, for example, 512 rows and around 16,000 columns. A sensing component stripe can be used as a building block to construct the larger memory. In an array for a memory device, there may be, for example, 32, 64, or 128 sensing component stripes, which correspond to 32, 64, or 128 subarrays, as described herein. Hence, for example, 512 rows times 128 sensing component stripes would yield around 66,000 rows intersected by around 16,000 columns to form around a 1 gigabit DRAM.

As such, when processing at the sense amplifier level, there are only 512 rows of memory cells available to perform operations with each other and it may not be possible to easily perform operations on multiple rows where data is coupled to different sensing component stripes. To accomplish processing of data in different subarrays coupled to different sensing component stripes, all the data to be processed may be moved into the same subarray in order to be coupled to the same sensing component stripe.

However, DRAM implementations have not been utilized to move data from one sensing component stripe to another sensing component stripe. As mentioned, a sensing component stripe can contain as many as 16,000 sense amplifiers, which corresponds to around 16,000 columns or around 16,000 data values (e.g., bits) of data to be stored (e.g., cached) from each row. A DRAM DQ data bus (e.g., as shown at 156 in FIGS. 1A and 1B) may be configured as a 64 bit part. As such, to move (e.g., transfer and/or copy) the entire data from a 16,000 bit row from one sensing component stripe to another sensing component stripe using a DRAM DQ data bus would take, for instance, 256 cycles (e.g., 16,000 divided by 64).

In order to achieve data movement conducted with a high speed, rate, and/or efficiency from one sensing component stripe to another in PIM DRAM implementations, shared I/O lines 155 are described herein. For example, with 2048 shared I/O lines configured as a 2048 bit wide shared I/O line 155, movement of data from a full row, as just described, would take 8 cycles, a 32 times increase in the speed, rate, and/or efficiency of data movement. As such, compared to other PIM DRAM implementations, utilization of the structures and processes described herein my save time for data movement (e.g., by not having to read data out of one bank, bank section, and subarray thereof, storing the data, and then writing the data in another location) and by reducing the number of cycles for data movement.

Figure 2:
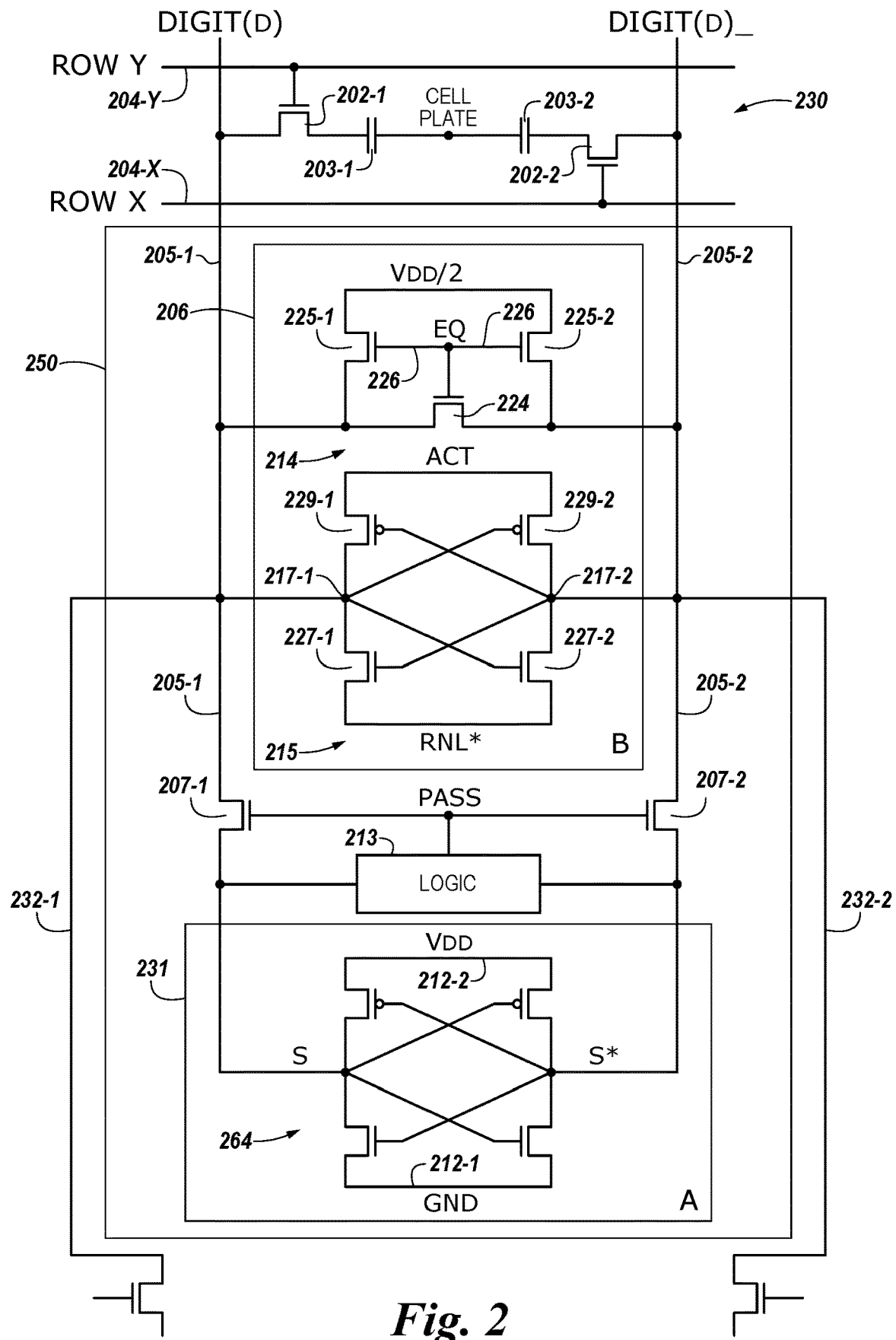
FIG. 2 is a schematic diagram illustrating sensing circuitry of a memory device in accordance with a number of embodiments of the present disclosure.

FIG. 2 is a schematic diagram illustrating sensing circuitry 250 in accordance with a number of embodiments of the present disclosure. The sensing circuitry 250 can correspond to sensing circuitry 150 shown in FIG. 1A.

A memory cell can include a storage element (e.g., capacitor) and an access device (e.g., transistor). For instance, a first memory cell can include transistor 202-1 and capacitor 203-1, and a second memory cell can include transistor 202-2 and capacitor 203-2, etc. In this embodiment, the memory array 230 is a DRAM array of 1T1C (one transistor one capacitor) memory cells, although other embodiments of configurations can be used (e.g., 2T2C with two transistors and two capacitors per memory cell). In a number of embodiments, the memory cells may be destructive read memory cells (e.g., reading the data stored in the cell destroys the data such that the data originally stored in the cell is refreshed after being read).

Figure 3:
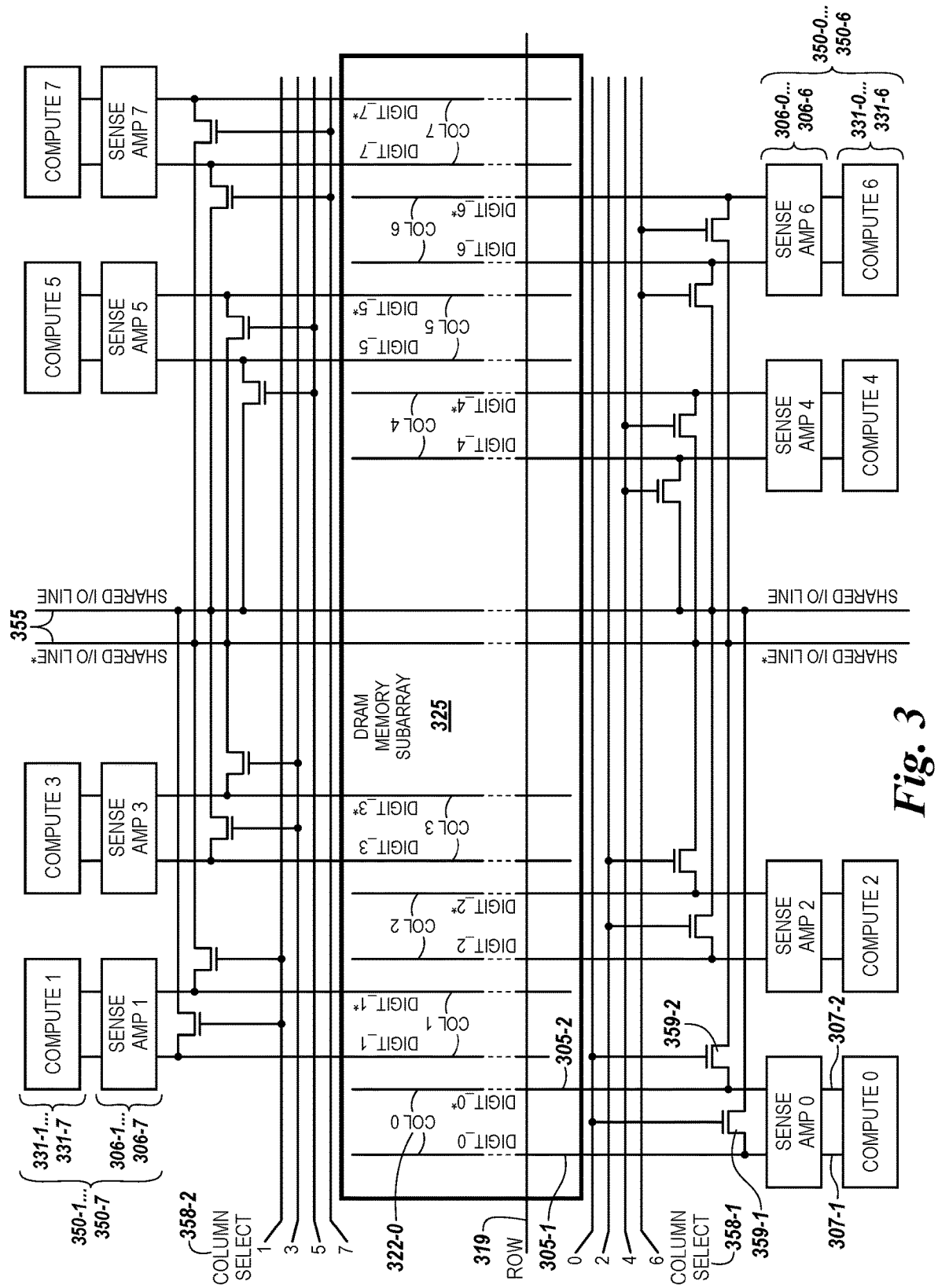
FIG. 3 is a schematic diagram illustrating circuitry for data movement to a memory device in accordance with a number of embodiments of the present disclosure.
Figure 4A:
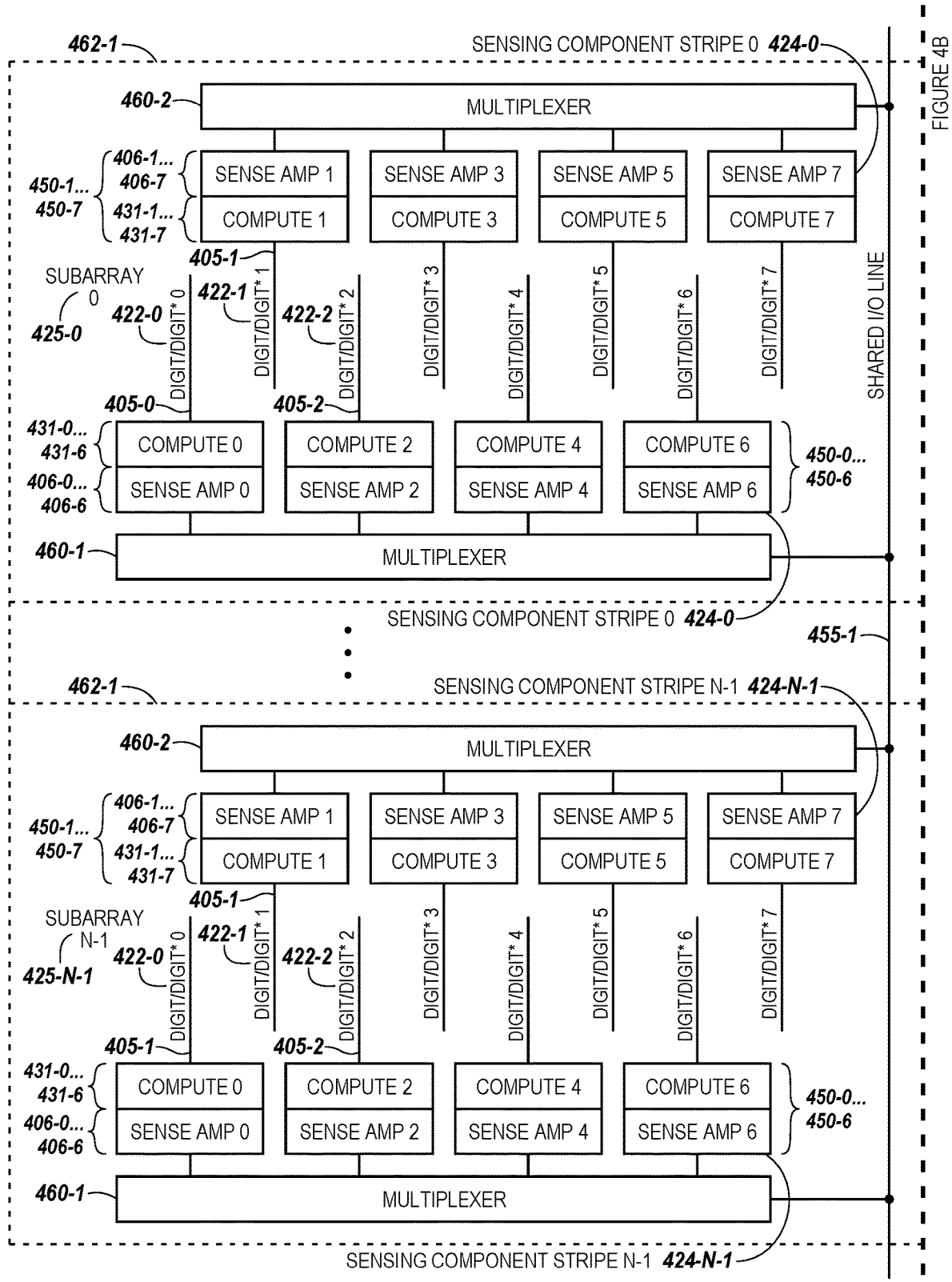
FIGS. 4A and 4B represent another schematic diagram illustrating circuitry for data movement to a memory device in accordance with a number of embodiments of the present disclosure.
Figure 4B:
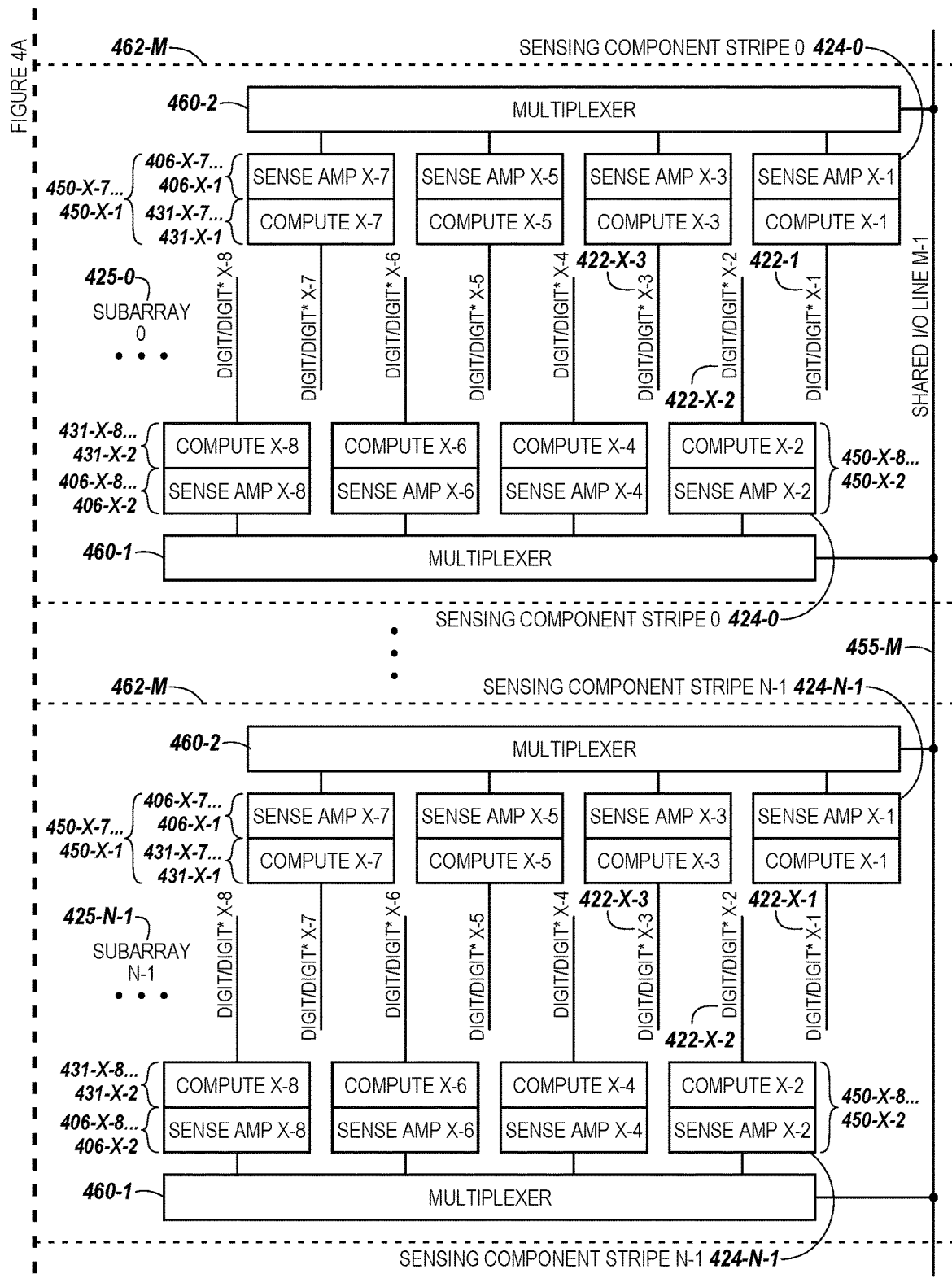

The cells of the memory array 230 can be arranged in rows coupled by access (word) lines 204-X (Row X), 204-Y (Row Y), etc., and columns coupled by pairs of complementary sense lines (e.g., digit lines DIGIT(D) and DIGIT (D) shown in FIG. 2 and DIGIT_0 and DIGIT_0* shown in FIGS. 3 and 4A-4B). The individual sense lines corresponding to each pair of complementary sense lines can also be referred to as digit lines 205-1 for DIGIT (D) and 205-2 for DIGIT (D)_, respectively, or corresponding reference numbers in FIGS. 3 and 4A-4B. Although only one pair of complementary digit lines are shown in FIG. 2, embodiments of the present disclosure are not so limited, and an array of memory cells can include additional columns of memory cells and digit lines (e.g., 4,096, 8,192, 16,384, etc.).

Although rows and columns are illustrated as orthogonally oriented in a plane, embodiments are not so limited. For example, the rows and columns may be oriented relative to each other in any feasible three-dimensional configuration. The rows and columns may be oriented at any angle relative to each other, may be oriented in a substantially horizontal plane or a substantially vertical plane, and/or may be oriented in a folded topology, among other possible three-dimensional configurations.

Memory cells can be coupled to different digit lines and word lines. For example, a first source/drain region of a transistor 202-1 can be coupled to digit line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to digit line 205-2 (D)_, a second source/drain region of transistor 202-2 can be coupled to capacitor 203-2, and a gate of a transistor 202-2 can be coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The memory array 230 is configured to couple to sensing circuitry 250 in accordance with a number of embodiments of the present disclosure. In this embodiment, the sensing circuitry 250 comprises a sense amplifier 206 and a compute component 231 corresponding to respective columns of memory cells (e.g., coupled to respective pairs of complementary digit lines). The sense amplifier 206 can be coupled to the pair of complementary digit lines 205-1 and 205-2.

The compute component 231 can be coupled to the sense amplifier 206 via pass gates 207-1 and 207-2. The gates of the pass gates 207-1 and 207-2 can be coupled to operation selection logic 213.

The operation selection logic 213 can be configured to include pass gate logic for controlling pass gates that couple the pair of complementary digit lines un-transposed between the sense amplifier 206 and the compute component 231 and swap gate logic for controlling swap gates that couple the pair of complementary digit lines transposed between the sense amplifier 206 and the compute component 231. The operation selection logic 213 can also be coupled to the pair of complementary digit lines 205-1 and 205-2. The operation selection logic 213 can be configured to control continuity of pass gates 207-1 and 207-2 based on a selected operation.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary digit lines D 205-1 and (D)_205-2. However, embodiments are not limited to this example. The latch 215 can be a cross coupled latch, e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). The cross coupled latch 215 comprising transistors 227-1, 227-2, 229-1, and 229-2 can be referred to as a primary latch.

In operation, when a memory cell is being sensed (e.g., read), the voltage on one of the digit lines 205-1 (D) or 205-2 (D)_will be slightly greater than the voltage on the other one of digit lines 205-1 (D) or 205-2 (D)_. An ACT signal and an RNL* signal can be driven low to enable (e.g., fire) the sense amplifier 206. The digit lines 205-1 (D) or 205-2 (D)_having the lower voltage will turn on one of the PMOS transistor 229-1 or 229-2 to a greater extent than the other of PMOS transistor 229-1 or 229-2, thereby driving high the digit line 205-1 (D) or 205-2 (D)_having the higher voltage to a greater extent than the other digit line 205-1 (D) or 205-2 (D)_is driven high.

Similarly, the digit line 205-1 (D) or 205-2 (D)_having the higher voltage will turn on one of the NMOS transistor 227-1 or 227-2 to a greater extent than the other of the NMOS transistor 227-1 or 227-2, thereby driving low the digit line 205-1 (D) or 205-2 (D)_having the lower voltage to a greater extent than the other digit line 205-1 (D) or 205-2 (D)_is driven low. As a result, after a short delay, the digit line 205-1 (D) or 205-2 (D)_having the slightly greater voltage is driven to the voltage of the supply voltage $V_{CC}$ through a source transistor, and the other digit line 205-1 (D) or 205-2 (D)_is driven to the voltage of the reference voltage (e.g., ground) through a sink transistor. Therefore, the cross coupled NMOS transistors 227-1 and 227-2 and PMOS transistors 229-1 and 229-2 serve as a sense amplifier pair, which amplify the differential voltage on the digit lines 205-1 (D) and 205-2 (D)_and operate to latch a data value sensed from the selected memory cell. As used herein, the cross coupled latch of sense amplifier 206 may be referred to as a primary latch 215.

Embodiments are not limited to the sense amplifier 206 configuration illustrated in FIG. 2. As an example, the sense amplifier 206 can be a current-mode sense amplifier and a single-ended sense amplifier (e.g., sense amplifier coupled to one digit line). Also, embodiments of the present disclosure are not limited to a folded digit line architecture such as that shown in FIG. 2.

The sense amplifier 206 can, in conjunction with the compute component 231, be operated to perform various operations using data from an array as input. In a number of embodiments, the result of an operation can be stored back to the array without transferring the data via a digit line address access (e.g., without firing a column decode signal such that data is transferred to circuitry external from the array and sensing circuitry via local I/O lines). As such, a number of embodiments of the present disclosure can enable performing operations and compute functions associated therewith using less power than various previous approaches. Additionally, since a number of embodiments eliminate the need to transfer data across local and global I/O lines in order to perform compute functions (e.g., between memory and discrete processor), a number of embodiments can enable an increased (e.g., faster) processing capability as compared to previous approaches.

The sense amplifier 206 can further include equilibration circuitry 214, which can be configured to equilibrate the digit lines 205-1 (D) and 205-2 (D)_. In this example, the equilibration circuitry 214 comprises a transistor 224 coupled between digit lines 205-1 (D) and 205-2 (D)_. The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled digit line 205-1 (D), and a second source/drain region of transistor 225-2 can be coupled digit line 205-2 (D)_. Gates of transistors 224, 225-1, and 225-2 can be coupled together, and to an equilibration (EQ) control signal line 226. As such, activating EQ enables (e.g., activates) the transistors 224, 225-1, and 225-2, which effectively shorts digit lines 205-1 (D) and 205-2 (D)_together and to the equilibration voltage (e.g., $V_{CC}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry 250 (e.g., sense amplifier 206 and compute component 231) can be operated to perform a selected operation and initially store the result in one of the sense amplifier 206 or the compute component 231 without transferring data from the sensing circuitry via a local or global I/O line (e.g., without performing a sense line address access via activation of a column decode signal, for instance).

Performance of various types of operations can be implemented. For example, Boolean operations (e.g., Boolean logical functions involving data values) are used in many higher level applications. Consequently, speed and power efficiencies that can be realized with improved performance of the operations may provide improved speed and/or power efficiencies for these applications.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) included in the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component 231 is not limited to that shown in FIG. 2, and various other embodiments are feasible.

In various embodiments, connection circuitry 232-1 can, for example, be coupled at 217-1 and connection circuitry 232-2 can be coupled at 217-1 to the primary latch 215 for movement of sensed and/or stored data values. The sensed and/or stored data values can be moved to a selected memory cell in a particular row and/or column of another subarray via a shared I/O line, as described herein, and/or directly to the selected memory cell in the particular row and/or column of the other subarray via connection circuitry 232-1 and 232-2. Although FIG. 2 shows connection circuitry 232-1 and 232-2 to be coupled at 217-1 and 217-2, respectively, of the primary latch 215, embodiments are not so limited. For example, connection circuitry 232-1 and 232-2 can, for example, be coupled to the secondary latch 264 for movement of the sensed and/or stored data values, among other possible locations for coupling connection circuitry 232-1 and 232-2.

FIG. 3 is a schematic diagram illustrating circuitry for data movement in a memory device in accordance with a number of embodiments of the present disclosure. FIG. 3 shows eight sense amplifiers (e.g., sense amplifiers 0, 1, . . . , 7 shown at 306-0, 306-1, . . . , 306-7, respectively) each coupled to a respective pair of complementary sense lines (e.g., digit lines 305-1 and 305-2). FIG. 3 also shows eight compute components (e.g., compute components 0, 1, . . . , 7 shown at 331-0, 331-1, . . . , 331-7) each coupled to a respective sense amplifier (e.g., as shown for sense amplifier 0 at 306-0) via respective pass gates and digit lines 307-1 and 307-2. For example, the pass gates can be connected as shown in FIG. 2 and can be controlled by an operation selection signal, Pass. For example, an output of the selection logic can be coupled to the gates of the pass gates and digit lines 307-1 and 307-2. Corresponding pairs of the sense amplifiers and compute components can contribute to formation of the sensing circuitry indicated at 350-0, 350-1, . . . , 350-7.

Data values present on the pair of complementary digit lines 305-1 and 305-2 can be loaded into the compute component 331-0 as described in connection with FIG. 2. For example, when the pass gates are enabled, data values on the pair of complementary digit lines 305-1 and 305-2 can be passed from the sense amplifiers to the compute component (e.g., 306-0 to 331-0). The data values on the pair of complementary digit lines 305-1 and 305-2 can be the data value stored in the sense amplifier 306-0 when the sense amplifier is fired.

The sense amplifiers 306-0, 306-1, . . . , 306-7 in FIG. 3 can each correspond to sense amplifier 206 shown in FIG. 2. The compute components 331-0, 331-1, . . . , 331-7 shown in FIG. 3 can each correspond to compute component 231 shown in FIG. 2. A combination of one sense amplifier with one compute component can contribute to the sensing circuitry (e.g., 350-0, 350-1, . . . , 350-7) of a portion of a DRAM memory subarray 325 configured to couple to a shared I/O line 355, as described herein. The paired combinations of the sense amplifiers 306-0, 306-1, . . . , 306-7 and the compute components 331-0, 331-1, . . . , 331-7, shown in FIG. 3, can be included in a sensing component stripe, as shown at 124 in FIG. 1B and at 424 in FIGS. 4A and 4B.

The configurations of embodiments illustrated in FIG. 3 are shown for purposes of clarity and are not limited to these configurations. For instance, the configuration illustrated in FIG. 3 for the sense amplifiers 306-0, 306-1, . . . , 306-7 in combination with the compute components 331-0, 331-1, . . . , 331-7 and the shared I/O line 355 is not limited to half the combination of the sense amplifiers 306-0, 306-1, . . . , 306-7 with the compute components 331-0, 331-1, . . . , 331-7 of the sensing circuitry being formed above the columns 322 of memory cells (not shown) and half being formed below the columns 322 of memory cells. Nor are the number of such combinations of the sense amplifiers with the compute components forming the sensing circuitry configured to couple to a shared I/O line limited to eight. In addition, the configuration of the shared I/O line 355 is not limited to being split into two for separately coupling each of the two sets of complementary digit lines 305-1 and 305-2, nor is the positioning of the shared I/O line 355 limited to being in the middle of the combination of the sense amplifiers and the compute components forming the sensing circuitry (e.g., rather than being at either end of the combination of the sense amplifiers and the compute components).

The circuitry illustrated in FIG. 3 also shows column select circuitry 358-1 and 358-2 that is configured to implement data movement operations with respect to particular columns 322 of a subarray 325, the complementary digit lines 305-1 and 305-2 associated therewith, and the shared I/O line 355 (e.g., as directed by the controller 140 shown in FIGS. 1A-1C). For example, column select circuitry 358-1 has select lines 0, 2, 4, and 6 that are configured to couple with corresponding columns, such as column 0, column 2, column 4, and column 6. Column select circuitry 358-2 has select lines 1, 3, 5, and 7 that are configured to couple with corresponding columns, such as column 1, column 3, column 5, and column 7. The column select circuitry 358 illustrated in connection with FIG. 3 can, in various examples, represent at least a portion of the functionality embodied by and contained in the multiplexers 460 illustrated in connection with FIGS. 4A and 4B.

Controller 140 can be coupled to column select circuitry 358 to control select lines (e.g., select line 0) to access data values stored in the sense amplifiers, compute components and/or present on the pair of complementary digit lines (e.g., 305-1 and 305-2 when selection transistors 359-1 and 359-2 are activated via signals from column select line 0). Activating the selection transistors 359-1 and 359-2 (e.g., as directed by the controller 140) enables coupling of sense amplifier 306-0, compute component 331-0, and/or complementary digit lines 305-1 and 305-2 of column 0 (322-0) to move data values on digit line 0 and digit line 0* to shared I/O line 355. For example, the moved data values may be data values from a particular row 319 stored (cached) in sense amplifier 306-0 and/or compute component 331-0. Data values from each of columns 0 through 7 can similarly be selected by controller 140 activating the appropriate selection transistors.

Moreover, activating the selection transistors (e.g., selection transistors 359-1 and 359-2) enables a particular sense amplifier and/or compute component (e.g., 306-0 and/or 331-0) to be coupled with a shared I/O line 355 such that the sensed (stored) data values can be moved to (e.g., placed on and/or transferred to) the shared I/O line 355. In some embodiments, one column at a time is selected (e.g., column 322-0) to be coupled to a particular shared I/O line 355 to move (e.g., transfer and/or copy) the sensed data values. In the example configuration of FIG. 3, the shared I/O line 355 is illustrated as a shared, differential I/O line pair (e.g., shared I/O line and shared I/O line*). Hence, selection of column 0 (322-0) could yield two data values (e.g., two bits with values of 0 and/or 1) from a row (e.g., row 319) and/or as stored in the sense amplifier and/or compute component associated with complementary digit lines 305-1 and 305-2. These data values could be moved (e.g., transferred, transported, and/or fed) in parallel to each of the shared, differential I/O pair (e.g., shared I/O and shared I/O*) of the shared differential I/O line 355.

As described herein, a memory device (e.g., 120 in FIG. 1A) can be configured to couple to a host (e.g., 110) via a data bus (e.g., 156) and a control bus (e.g., 154). A bank in the memory device (e.g., 123 in FIG. 1B) can include a plurality of subarrays (e.g., 125-0, 125-1, . . . , 125-N-1 in FIGS. 1B and 1C) of memory cells and sensing circuitry (e.g., 150 in FIG. 1A) coupled to the plurality of subarrays via a plurality of columns (e.g., 122 in FIG. 1B) of the memory cells. The sensing circuitry can include a sense amplifier and a compute component (e.g., 206 and 231, respectively, in FIG. 2) coupled to each of the columns.

The bank can include a plurality of subarray controllers (e.g., 170-0, 170-1, . . . , 170-N-1 in FIG. 1C). Each subarray controller can be coupled to a respective subarray of the plurality of subarrays (e.g., 125-0, 125-1, . . . , 125-N-1 in FIGS. 1B and 1C) and each subarray controller can be configured to direct performance of an operation with respect to data stored in the respective subarray of the plurality of subarrays. For example, the subarray controllers can be individually coupled to each of the plurality of subarrays to direct execution of an operation (e.g., a single operation) upon data stored in a plurality of (e.g., a selected subset of or all) memory cells in each of the plurality of subarrays.

The memory device can, in various embodiments, be configured to move a data value corresponding to a result of an operation with respect to data stored in a first subarray of the plurality of subarrays to a memory cell in a second subarray of the plurality of subarrays. For example, the sensing circuitry 150 can be configured to couple to the plurality of subarrays (e.g., via the shared I/O lines 355, column select circuitry 358, and/or the multiplexers 460 described herein) to move a data value upon which a first operation has been performed in a first subarray to a memory cell in a second subarray for performance of a second operation.

In various embodiments, the first operation performed with respect to the first subarray and the second operation performed with respect to the second subarray can be a sequence (e.g., part of the sequence) of a plurality of operations with instructions executed by the plurality of subarray controllers individually coupled to each of the plurality of subarrays. A first set of instructions, when executed, can direct performance of the first operation on data stored in the first subarray that, in some embodiments, can be different from the second operation performed on data stored in the second subarray as directed by execution of a second set of instructions. The sensing circuitry can be configured to couple to the plurality of subarrays to implement parallel movement of data values stored in the first subarray, upon which a first operation has been performed, to a plurality of memory cells in the second subarray.

The memory device can include a shared I/O line (e.g., 155 in FIG. 1C) configured to be coupled to the sensing circuitry of each of the plurality of subarrays to selectably implement movement of the data value stored in the first subarray, upon which the first operation has been performed, to the memory cell in the second subarray. In various embodiments, the memory device can include a plurality of shared I/O lines (e.g., 355 in FIGS. 3 and 455-1, 455-2, ..., 455-M in FIGS. 4A and 4B) configured to couple to the sensing circuitry of each of the plurality of subarrays to selectably implement parallel movement of a plurality of data values stored in the first subarray, upon which the first operation has been performed, to a plurality of memory cells in the second subarray.

The memory device can include a sensing component stripe (e.g., 124 in FIG. 1B and 424 in FIGS. 4A and 4B) configured to include a number of a plurality of sense amplifiers and compute components (e.g., 306-0, 306-1, ..., 306-7 and 331-0, 331-1, ..., 331-7, respectively, as shown in FIG. 3) that can correspond to a number of the plurality of columns (e.g., 305-1 and 305-2) of the memory cells, where the number of sense amplifiers and compute components can be selectably coupled to the plurality of shared I/O lines (e.g., via column select circuitry 358-1 and 358-2). The column select circuitry can be configured to selectably sense data in a particular column of memory cells of a subarray by being selectably coupled to a plurality of (e.g., eight) sense amplifiers and compute components.

In some embodiments, a number of a plurality of sensing component stripes (e.g., 124-0, ..., 124-N in FIGS. 1B and 1C) in the bank of the memory device can correspond to a number of the plurality of subarrays (e.g., 125-0, 125-1, ..., 125-N-1 in FIGS. 1B and 1C) in the bank. A sensing component stripe can include a number of sense amplifiers and compute components configured to move (e.g., transfer and/or transport) an amount of data sensed from a row of the first subarray in parallel to a plurality of shared I/O lines. In some embodiments, the amount of data can correspond to at least a thousand bit width of the plurality of shared I/O lines.

As described herein, the array of memory cells can include an implementation of DRAM memory cells where the controller is configured, in response to a command, to move data from the source location to the destination location via a shared I/O line. The source location can be in a first bank and the destination location can be in a second bank in the memory device and/or the source location can be in a first subarray of one bank in the memory device and the destination location can be in a second subarray of the same bank. The first subarray and the second subarray can be in the same section of the bank or the subarrays can be in different sections of the bank.

As described herein, the apparatus can be configured to move data from a source location, including a particular row (e.g., 319 in FIG. 3) and column address associated with a first number of sense amplifiers and compute components (e.g., 406-0 and 431-0, respectively) in subarray 0 (425-0) to a shared I/O line (e.g., 455-1). In addition, the apparatus can be configured to move the data to a destination location, including a particular row and column address associated with a second number of sense amplifier and compute component (e.g., 406-0 and 431-0, respectively, in subarray N-1 (425-N-1) using the shared I/O line (e.g., 455-1). As the reader will appreciate, each shared I/O line (e.g., 455-1) can actually include a complementary pair of shared I/O lines (e.g., shared I/O line and shared I/O line* as shown in the example configuration of FIG. 3). In some embodiments described herein, 2048 shared I/O lines (e.g., complementary pairs of shared I/O lines) can be configured as a 2048 bit wide shared I/O line.

FIGS. 4A and 4B represent another schematic diagram illustrating circuitry for data movement in a memory device in accordance with a number of embodiments of the present disclosure. As illustrated in FIGS. 1B and 1C and shown in more detail in FIGS. 4A and 4B, a bank section of a DRAM memory device can include a plurality of subarrays, which are indicated in FIGS. 4A and 4B at 425-0 as subarray 0 and at 425-N-1 as subarray N-1.

FIGS. 4A and 4B, which are to be considered as horizontally connected, illustrate that each subarray (e.g., subarray 425-0) partly shown in FIG. 4A and partly shown in FIG. 4B) can have a number of associated sense amplifiers 406-0, 406-1, ..., 406-X-1 and compute components 431-0, 431-1, ..., 431-X-1. For example, each subarray, 425-0, ..., 425-N-1, can have one or more associated sensing component stripes (e.g., 124-0, ..., 124-N-1 in FIG. 1B). According to embodiments described herein, each subarray, 425-0, ..., 425-N-1, can be split into portions 462-1 (shown in FIG. 4A), 462-2, ..., 462-M (shown in FIG. 4B). The portions 462-1, ..., 462-M may be defined by coupling a selectable number (e.g., 2, 4, 8, 16, etc.) of the sense amplifiers and compute components (e.g., sensing circuitry 150), along with the corresponding columns (e.g., 422-0, 422-1, ..., 422-7) among columns 422-0, ..., 422-X-1, to a given shared I/O line (e.g., 455-M). Corresponding pairs of the sense amplifiers and compute components can contribute to formation of the sensing circuitry indicated at 450-0, 450-1, ..., 450-X-1 in FIGS. 4A and 4B.

In some embodiments, as shown in FIGS. 3, 4A, and 4B, the particular number of the sense amplifiers and compute components, along with the corresponding columns, that can be selectably coupled to a shared I/O line 455 (which may be a pair of shared differential lines) can be eight. The number of portions 462-1, 462-2, ..., 462-M of the subarray can be the same as the number of shared I/O lines 455-1, 455, 2, ..., 455-M that can be coupled to the subarray. The subarrays can be arranged according to various DRAM architectures for coupling shared I/O lines 455-1, 455, 2, ..., 455-M between subarrays 425-0, 425-1, ..., 425-N-1.

For example, portion 462-1 of subarray 0 (425-0) in FIG. 4A can correspond to the portion of the subarray illustrated in FIG. 3. As such, sense amplifier 0 (406-0) and compute component 0 (431-0) can be coupled to column 422-0. As described herein, a column can be configured to include a pair of complementary digit lines referred to as digit line 0 and digit line 0*. However, alternative embodiments can include a single digit line 405-0 (sense line) for a single column of memory cells. Embodiments are not so limited. The column select circuitry 358 illustrated in FIG. 3 and/or the multiplexers illustrated in FIGS. 4A and 4B can selectably sense data in a particular column of memory cells of a subarray by being selectably coupled to at least one of the sense amplifier and compute component coupled to a respective sense line of the particular column.

As illustrated in FIGS. 1B and 1C and shown in more detail in FIGS. 4A and 4B, a sensing component stripe can, in various embodiments, extend from one end of a subarray to an opposite end of the subarray. For example, as shown for subarray 0 (425-0), sensing component stripe 0 (424-0), which is shown schematically above and below the DRAM columns in a folded sense line architecture, can include and extend from sense amplifier 0 (406-0) and compute component 0 (431-0) in portion 462-1 to sense amplifier X-1

(406-X-1) and compute component X-1 (431-X-1) in portion 462-M of subarray 0 (425-0).

As described in connection with FIG. 3, the configuration illustrated in FIGS. 4A and 4B for the sense amplifiers 406-0, 406-1, . . . , 406-X-1 in combination with the compute components 431-0, 431-1, . . . , 431-X-1 and shared I/O line 0 (455-1) through shared I/O line M-1 (455-M) is not limited to half the combination of the sense amplifiers with the compute components of the sensing circuitry (450) being formed above the columns of memory cells and half being formed below the columns of memory cells 422-0, 422-1, . . . , 422-X-1 in a folded DRAM architecture. For example, in various embodiments, a sensing component stripe 424 for a particular subarray 425 can be formed with any number of the sense amplifiers and compute components of the sensing component stripe being formed above and below the columns of memory cells. Accordingly, in some embodiments as illustrated in FIGS. 1B and 1C, all of the sense amplifiers and compute components of the sensing circuitry and corresponding sensing component stripes can be formed above or below the columns of memory cells.

As described in connection with FIG. 3, each subarray can have column select circuitry (e.g., 358) that is configured to implement data movement operations on particular columns 422 of a subarray, such as subarray 0 (425-0), and the complementary digit lines thereof, coupling stored data values from the sense amplifiers 406 and/or compute components 431 to given shared I/O lines 455-1, . . . , 455-M (e.g., complementary shared I/O lines 355 in FIG. 3). For example, the controller 140 can direct that data values of memory cells in a particular row (e.g., row 319) of subarray 0 (425-0) be sensed and moved to a same or different numbered row of subarrays 425-1, 425-2, . . . , 425-N-1 in a same or different numbered column. For example, in some embodiments, the data values can be moved from a portion of a first subarray to a different portion of a second subarray (e.g., not necessarily from portion 462-1 of subarray 0 to portion 462-1 of subarray N-1). For example, in some embodiments data values may be moved from a column in portion 462-1 to a column in portion 462-M using shifting techniques.

The column select circuitry (e.g., 358 in FIG. 3) can direct movement (e.g., sequential movement) of each of the eight columns (e.g., digit/digit*) in the portion of the subarray (e.g., portion 462-1 of subarray 425-0) for a particular row such that the sense amplifiers and compute components of the sensing component stripe (e.g., 424-0) for that portion can store (cache) and move all data values to the shared I/O line in a particular order (e.g., in an order in which the columns were sensed). With complementary digit lines, digit/digit*, and complementary shared I/O lines 355, for each of eight columns, there can be 16 data values (e.g., bits) sequenced to the shared I/O line from one portion of the subarray such that one data value (e.g., bit) is moved (e.g., transferred, transported, and/or fed) to each of the complementary shared I/O lines at a time from each of the sense amplifiers and compute components.

As such, with 2048 portions of subarrays each having eight columns (e.g., subarray portion 462-1 of each of subarrays 425-0, 425-1, . . . , 425-N-1), and each configured to couple to a different shared I/O line (e.g., 455-1 through 455-M) 2048 data values (e.g., bits) could be moved to the plurality of shared I/O lines at substantially the same point in time (e.g., in parallel). Accordingly, the plurality of shared I/O lines might be, for example, at least a thousand bits wide (e.g., 2048 bits wide), such as to increase the speed, rate, and/or efficiency of data movement in a DRAM implementation (e.g., relative to a 64 bit wide data path).

As illustrated in FIGS. 4A and 4B, in each subarray (e.g., subarray 425-0) one or more multiplexers 460-1 and 460-2 can be coupled to the sense amplifiers and compute components of each portion 462-1, 462-2, . . . , 462-M of the sensing component stripe 424-0 for the subarray. The multiplexers 460 illustrated in connection with FIGS. 4A and 4B can, in various embodiments, be inclusive of at least the functionality embodied by and contained in the column select circuitry 358 illustrated in connection with FIG. 3. The multiplexers 460-1 and 460-2 can be configured to access, select, receive, coordinate, combine, and move (e.g., transfer and/or transport) the data values (e.g., bits) stored (cached) by the number of selected sense amplifiers and compute components in a portion (e.g., portion 462-1) of the subarray to the shared I/O line (e.g., shared I/O line 455-1). As such, a shared I/O line, as described herein, can be configured to couple a source location and a destination location between pairs of bank section subarrays for improved data movement.

As described herein, a controller (e.g., 140) can be coupled to a bank of a memory device (e.g., 121) to execute a command to move data in the bank from a source location (e.g., subarray 425-0) to a destination location (e.g., subarray 425-N-1). A bank section can, in various embodiments, include a plurality of subarrays of memory cells in the bank section (e.g., subarrays 125-0 through 125-N-1 and 425-0 through 425-N-1). The bank section can, in various embodiments, further include sensing circuitry (e.g., 150) coupled to the plurality of subarrays via a plurality of columns (e.g., 322-0, 422-0, and 422-1) of the memory cells. The sensing circuitry can include a sense amplifier and a compute component (e.g., 206 and 231, respectively, in FIG. 2 and at corresponding reference numbers in FIGS. 3, 4A and 4B) coupled to each of the columns and configured to implement the command to move the data.

The bank section can, in various embodiments, further include a shared I/O line (e.g., 155, 355, 455-1, and 455-M) to couple the source location and the destination location to move the data. In addition, the controller can be configured to direct the plurality of subarrays and to the sensing circuitry to perform a data write operation on the moved data to the destination location in the bank section (e.g., a selected memory cell in a particular row and/or column of a different selected subarray).

According to various embodiments, the apparatus can include a sensing component stripe (e.g., 124 and 424) including a number of sense amplifiers and compute components that corresponds to a number of columns of the memory cells (e.g., where each column of memory cells is configured to couple to a sense amplifier and a compute component). The number of sensing component stripes in the bank section (e.g., 424-0 through 424-N-1) can correspond to a number of subarrays in the bank section (e.g., 425-0 through 425-N-1).

The number of sense amplifiers and compute components can be selectably (e.g., sequentially) coupled to the shared I/O line (e.g., as shown by column select circuitry at 358-1, 358-2, 359-1, and 359-2 in FIG. 3). The column select circuitry can be configured to selectably couple a shared I/O line to, for example, one or more of eight sense amplifiers and compute components in the source location (e.g., as shown in subarray 325 in FIG. 3 and subarray portions 462-1 through 462-M in FIGS. 4A and 4B). As such, the eight sense amplifiers and compute components in the source location can be sequentially coupled to the shared I/O line.

According to some embodiments, a number of shared I/O lines formed in the array can correspond to a division of a number of columns in the array by the eight sense amplifiers and compute components that can be selectably coupled to each of the shared I/O lines. For example, when there are 16,384 columns in the array (e.g., bank section), or in each subarray thereof, and one sense amplifier and compute component per column, 16,384 columns divided by eight yields 2048 shared I/O lines. The apparatus can, in various embodiments, include a number of multiplexers (e.g., as shown at 460-1 and 460-2 in portions 462-1 through 462-M of various subarrays in FIGS. 4A and 4B). As such, according to various embodiments, the apparatus can include a plurality of sense amplifiers and compute components and a multiplexer to select a sense amplifier and a compute component to couple to the shared I/O line. The multiplexers can be formed between the sense amplifiers and compute components and the shared I/O line to access, select, receive, coordinate, combine, and move (e.g., transfer and/or transport) selected data to the coupled shared I/O line.

As described herein, an array of memory cells can include a column of memory cells having a pair of complementary sense (digit) lines (e.g., 305-1 and 305-2 in FIG. 3). The sensing circuitry can, in some embodiments, include a sense amplifier (e.g., 306-0) selectably coupled to each of the pair of complementary sense (digit) lines and a compute component (e.g., 331-0) coupled to the sense amplifier via pass gates (e.g., 307-1 and 307-2).

According to some embodiments, a source sensing component stripe (e.g., 124 and 424) can include a number of sense amplifiers and compute components that can be selected and configured to move (e.g., transfer and/or transport) data values (e.g., a number of bits) sensed from a row of the source location in parallel to a plurality of shared I/O lines. For example, in response to commands for sequential sensing through the column select circuitry, the data values stored in memory cells of selected columns of a row of the subarray can be sensed by and stored (cached) in the sense amplifiers and compute components of the sensing component stripe until a number of data values (e.g., the number of bits) reaches the number of data values stored in the row and/or a threshold (e.g., the number of sense amplifiers and compute components in the sensing component stripe) and then move (e.g., transfer and/or transport) the data values via the plurality of shared I/O lines. In some embodiments, the threshold amount of data can correspond to the at least a thousand bit width of the plurality of shared I/O lines.

In some embodiments, the source sensing component stripe can include a number of sense amplifiers and compute components that can be selected and configured to store data values (e.g., bits) sensed from a row of the source location when an amount of sensed data values (e.g., the number of data bits) exceeds the at least a thousand bit width of the plurality of shared I/O lines. In this embodiment, the source sensing component stripe can be configured to move (e.g., transfer and/or transport) the data values sensed from the row of the source location when coupled to the plurality of shared I/O lines as a plurality of subsets. For example, the amount of at least a first subset of the data values can correspond to the at least a thousand bit width of the plurality of shared I/O lines.

The controller can, as described herein, be configured to move the data values from a selected row and a selected sense line in the source location to a selected row and a selected sense line in the destination location via the shared I/O line. In various embodiments, the data values can be moved in response to commands by the controller 140 and/or a particular subarray controller 170-0, 170-1, . . . , 170-N-1 coupled to a particular subarray 125-0, 125-1, . . . , 125-N-1, and/or a particular sensing component stripe 125-0, 125-1, . . . , 125-N-1 of the subarray. According to various embodiments, a selected row and a selected sense line in the source location (e.g., a first subarray) input to the controller can be different from a selected row and a selected sense line in the destination location (e.g., a second subarray).

As described herein, a location of the data in memory cells of the selected row and the selected sense line in a source subarray can be different from a location of the data moved to memory cells of a selected row and the selected source line in a destination subarray. For example, the source location may be a particular row and digit lines of portion 462-1 of subarray 0 (425-0) in FIG. 4A and the destination may be a different row and digit lines of portion 462-M in subarray N-1 (425-N-1) in FIG. 4B.

As described herein, a destination sensing component stripe (e.g., 124 and 424) can be the same as a source sensing component stripe. For example, a plurality of sense amplifiers and/or compute components can be selected and configured (e.g., depending on the command from the controller and/or subarray controllers 170-0, 170-1, . . . , 170-N-1) to selectably move (e.g., transfer and/or transport) sensed data to the coupled shared I/O line and selectably receive the data from one of a plurality of coupled shared I/O lines (e.g., to be moved to the destination location). Selection of sense amplifiers and compute components in the destination sensing component stripe can be performed using the column select circuitry (e.g., 358-1, 358-2, 359-1, and 359-2 in FIG. 3) and/or the multiplexers described herein (e.g., 460-1 and 460-2 in FIGS. 4A and 4B).

The controller can, according to some embodiments, be configured to write an amount of data (e.g., a number of data bits) selectably received by the plurality of selected sense amplifiers and/or compute components in the destination sensing component stripe to a selected row and a selected sense line of the destination location in the destination subarray. In some embodiments, the amount of data to write corresponds to the at least a thousand bit width of a plurality of shared I/O lines.

The destination sensing component stripe can, according to some embodiments, include a plurality of selected sense amplifiers and compute components configured to store received data values (e.g., bits) when an amount of received data values (e.g., the number of data bits) exceeds the at least a thousand bit width of the plurality of shared I/O lines. The controller can, according to some embodiments, be configured to write the stored data values (e.g., the number of data bits) to a selected row and a plurality of selected sense lines in the destination location as a plurality of subsets. In some embodiments, the amount of data values of at least a first subset of the written data can correspond to the at least a thousand bit width of the plurality of shared I/O lines. According to some embodiments, the controller can be configured to write the stored data values (e.g., the number of data bits) to the selected row and the selected sense line in the destination location as a single set (e.g., not as subsets of data values).

As described herein, a controller (e.g., 140) can be coupled to a bank (e.g., 121) of a memory device (e.g., 120) to execute a command for movement of data in the bank. A bank in the memory device can include a plurality of subarrays (e.g., 125-0, 125-1, . . . , 125-N-1 as shown in FIGS. 1B and 1C and 425-0, 425-1, . . . , 425-N-1 as shown in FIGS. 4A and 4B) of memory cells, a plurality of subarray controllers (e.g., 170-0, 170-1, . . . , 170-N-1 in FIG. 1C) individually coupled to each of the plurality of subarrays to direct performance of an operation (e.g., a single operation) upon data stored in a plurality (e.g., a selected subset or all) of the memory cells by the sensing circuitry in each of the plurality of subarrays.

The bank also can include sensing circuitry (e.g., 150 in FIG. 1A and 250 in FIG. 2) on pitch with the plurality of subarrays and coupled to the plurality of subarrays (e.g., via a plurality of sense lines 205-1 and 205-2 in FIGS. 2, 305-1 and 305-2 and at corresponding reference numbers in FIGS. 3, 4A and 4B). The sensing circuitry can include a sense amplifier and a compute component (e.g., 206 and 231, respectively, in FIG. 2 and at corresponding reference numbers in FIGS. 3, 4A and 4B) coupled to a sense line.

The controller 140 can be configured to provide a respective set of instructions to each of the plurality of subarray controllers (e.g., 170-0, 170-1, . . . , 170-N-1). For example, the controller can be configured to couple to the plurality of subarray controllers to input a respective set of instructions to be executed by each of the plurality of subarray controllers to direct performance of a respective operation by the sensing circuitry.

The plurality of subarrays of memory cells can be subarrays of DRAM cells. The controller can be configured to systolically move the data values between sequential subarrays in the bank of memory cells, in response to a command, using a DRAM protocol and DRAM logical and electrical interfaces, as described herein. In some embodiments, a host (e.g., 110 in FIG. 1A) can provide the data to the controller for the controller to execute the command for systolic movement of the data.

A first cache (e.g., 171-1 in FIG. 1C) can be associated with the controller. The first cache can be configured to receive data from the host and signal to the controller 140 that the data is received to initiate performance of a stored sequence of a plurality of operations. The controller can be configured to determine, based upon input of the data (e.g., analysis of the type and/or content of the unprocessed data in the cache), which of a plurality of sequences of operations performed by the subarray controllers coupled to the plurality of subarrays is appropriate for processing of the data. Accordingly, the controller can be configured to provide (e.g., input) the data to a particular subarray based upon a particular subarray controller coupled to the particular subarray performing a first operation in the appropriate stored contiguous sequence of operations. For example, the particular subarray can be coupled to a particular subarray controller configured to execute a first set of instructions to direct performance of a first operation in the appropriate stored contiguous sequence of operations upon data stored in the plurality of memory cells.

In various embodiments, connection circuitry (e.g., 232-1 and 232-2 in FIG. 2) can be configured to connect sensing circuitry coupled to a particular column in a first subarray to a number of rows in a corresponding column in a second (e.g., adjacent) subarray. As such, the connection circuitry can be configured to move (e.g., transfer and/or transport) a data value (e.g., from a selected row and the particular column) to a selected row and the corresponding column in the second subarray (e.g., the data value can be copied to a selected memory cell therein) for performance of a next operation in a sequence of operations. In some embodiments, the movement of the data value can be directed by the subarray controller of the first subarray executing a set of instructions when the data value is stored in the sensing circuitry and the controller can select a particular row and/or a particular memory cell intersected by the corresponding column in the second subarray to receive the data value by movement (e.g., transfer and/or transport) of the data value.

The controller (e.g., 140) can be coupled to the bank of the memory device to execute a command for movement of data from a start location to an end location in the bank. The plurality of subarray controllers (e.g., 170-0, 170-1, . . . , 170-N-1 in FIG. 1C) can be configured to couple to the controller to receive a respective set of instructions by each of the plurality of subarray controllers to direct performance of the operation with respect to data stored in each of the plurality of subarrays. For example, the plurality of subarray controllers can be configured to couple to the controller to receive input of a set of instructions into each of the plurality of subarray controllers to, when executed, direct performance of the operation on data of each respective subarray of the plurality of subarrays (e.g., 125-0, 125-1, . . . , 125-N-1 in FIGS. 1B and 1C and at corresponding reference numbers in FIGS. 4A and 4B). In various embodiments, the plurality of subarrays can include a plurality of sets of instructions to execute performance of different sequences of operations stored by the subarray controllers for a plurality of contiguous subsets of the subarrays (e.g., configured for processing of different data content).

The controller can be configured to provide (e.g., input) data to a particular subarray based upon a particular subarray controller coupled to the particular subarray being configured to execute a first set of instructions for an appropriate contiguous sequence of operations. The particular subarray controller coupled to the particular subarray can be the start location in the bank for performance of the appropriate stored contiguous sequence of operations (e.g., based upon the analysis of the type and/or content of the unprocessed data in the cache).

The particular subarray that is the start location can, in various embodiments, have at least one contiguous sequence of operations for a plurality of subarrays stored between the start location and a beginning of a first subarray in the bank. For example, the start location determined to be appropriate for the unprocessed data by the controller may be subarray 125-3 in FIG. 1C with the three subarrays 125-0, 125-1, and 125-2 being the first subarrays in the bank.

In various embodiments, completed performance of a contiguous sequence of a number of operations can be configured to yield an output at the end location in the subarrays of the bank, where a particular subarray at the end location has at least one subarray between the end location and an end of a last subarray in the bank. For example, the end location at which the number of operations is completed to yield the output may be subarray 125-3 in FIG. 1C with subarray 125-N-1 being the last subarray in the bank. The stored contiguous sequence of operations determined to be appropriate as the start location for input of the unprocessed data can have a plurality of subarrays between the start location and the beginning of the first subarray and an end location that has at least one subarray between the end location and the end of the last subarray. For example, the stored contiguous sequence of operations determined to be appropriate, and into which the unprocessed data is input, can be in the middle of a stack of subarrays, as described herein.

A second cache (e.g., 571-2 in FIG. 5) can be associated with the controller. The second cache can be configured to receive output of completed performance of a sequence of operations from the plurality of subarrays. The second cache can be configured to signal to the controller (e.g., 540 in FIG. 5) to initiate another iteration of performance of the sequence of operations by input of new received data to selected memory cells in a subarray (e.g., in particular columns and/or rows of the subarray) at the start location after the latency has expired. Prior to expiry of the latency, new received data also can be input For example, as described in connection with FIG. 5, a second batch of unprocessed data can be input into a first subarray 525-0 to be processed by performance of an AND operation after a first batch of unprocessed data has been processed therein and moved (e.g., transferred and/or copied) as a first set of data values for processing by a second subarray 525-1 to produce a second set of data values.

A command can be received from the controller to move data from the source location to the destination location (e.g., of a DRAM array of the memory cells). The data can be moved from the source location to the destination location (e.g., of the DRAM array) using the sense amplifiers and compute components via the plurality of shared I/O lines.

In some embodiments, 2048 shared I/O lines can be configured as a 2048 bit wide shared I/O line. According to some embodiments, a number of cycles for moving the data from a first row in the source location to a second row in the destination location can be determined by dividing a number of columns in the array intersected by a row of memory cells in the array by the 2048 bit width of the plurality of shared I/O lines. For example, an array (e.g., a bank, a bank section, and a subarray thereof) can have 16,384 columns, which can correspond to 16,384 data values in a row, which when divided by the 2048 bit width of the plurality of shared I/O lines intersecting the row can yield eight cycles, each separate cycle being at substantially the same point in time (e.g., in parallel) for movement of all the data in the row. Alternatively or in addition, a bandwidth for moving the data from a first row in the source location to a second row in the destination location can be determined by dividing the number of columns in the array intersected by the row of memory cells in the array by the 2048 bit width of the plurality of shared I/O lines and multiplying the result by a clock rate of the controller. In some embodiments, determining a number of data values in a row of the array can be based upon the plurality of sense (digit) lines in the array.

A source location in a first subarray of memory cells can be configured to couple via a plurality of shared I/O lines to a destination location in a second subarray of memory cells, where the plurality of shared I/O lines can be configured as at least a thousand bit wide shared I/O line. A first sensing component stripe (e.g., 424-0) for the first subarray (e.g., 425-0) and second sensing component stripe (e.g., 424-N-1) for second subarray (e.g., 425-N-1) can be configured to include a sense amplifier and a compute component (e.g., 406-0 and 431-0, respectively) coupled to each corresponding column of memory cells in the first and second subarrays (e.g., 422-0 through 422-X-1). A controller can be configured to couple to the memory cells of the first and second subarrays and the first and second sensing component stripes (e.g., via the column select circuitry 358-1, 358-2, 359-1, and 359-2).

The data can be moved from the source location in the first subarray via the plurality of shared I/O lines to the destination location in the second subarray using the first sensing component stripe for the first subarray and the second sensing component stripe for the second subarray. The first amplifier stripe for the first subarray and the second sensing component stripe for the second subarray can, accordingly to various embodiment, be configured to couple to the plurality of shared I/O lines (e.g., via the column select circuitry 358-1, 358-2, 359-1, and 359-2 in FIG. 3 and/or the multiplexers 460-1 and 460-2 in FIGS. 4A and 4B).

According to some embodiments, the source location in the first subarray and the destination location in the second subarray can be in a single bank section of a memory device (e.g., as shown in FIGS. 1B and 1C and FIGS. 4A and 4B). Alternatively or in addition, the source location in the first subarray and the destination location in the second subarray can be in separate banks and bank sections of the memory device coupled to a plurality of shared I/O lines. As such, the method can include moving the data (e.g., in parallel) from the first sensing component stripe for the first subarray via the plurality of shared I/O lines to the second sensing component stripe for the second subarray.

A sensing component stripe (e.g., all sensing component stripes 424-0 through 424-N-1) can be configured in each of a plurality of subarrays (e.g., subarrays 425-0 through 425-N-1) to couple to the plurality of shared I/O lines (e.g., shared I/O line 455-1). In some embodiments, only one of eight columns of complementary sense lines at a time in the first subarray can be coupled to one of the plurality of shared I/O lines using the first sensing component stripe (e.g., sensing component stripe 424-0) and only one of eight columns of complementary sense lines at a time in the second subarray can be coupled to one of the plurality of shared I/O lines using the second sensing component stripe (e.g., sensing component stripes 424-N-1).

The data can be moved from a number of sense amplifiers and compute components of the first sensing component stripe via the plurality of shared I/O lines to a corresponding number of sense amplifiers and compute components of the second sensing component stripe. For example, the data sensed from each sense amplifier and/or compute component of the source location can be moved to a corresponding sense amplifier and/or compute component in the destination location.

According to various embodiments, the controller and/or subarray controllers can select (e.g., open via an appropriate select line) a first row of memory cells, which corresponds to the source location, for the first sensing component stripe to sense data stored therein, couple (e.g., open) the plurality of shared I/O lines to the first sensing component stripe, and couple (e.g., open) the second sensing component stripe to the plurality of shared I/O lines (e.g., via the column select circuitry 358-1, 358-2, 359-1, and 359-2 and/or the multiplexers 460-1 and 460-2). As such, the data can be moved in parallel from the first sensing component stripe to the second sensing component stripe via the plurality of shared I/O lines. The first sensing component stripe can store (e.g., cache) the sensed data and the second sensing component stripe can store (e.g., cache) the moved data.

The controller and/or subarray controllers can select (e.g., open via an appropriate select line) a second row of memory cells, which corresponds to the destination location, for the second sensing component stripe (e.g., via the column select circuitry 358-1, 358-2, 359-1, and 359-2 and/or the multiplexers 460-1 and 460-2). The controller and/or subarray controllers can then direct writing the data moved to the second sensing component stripe to the destination location in the second row of memory cells.

In a DRAM implementation, a shared I/O line can be used as a data path (e.g., data flow pipeline) to move data in the memory cell array between various locations (e.g., subarrays) in the array. The shared I/O line can be shared between all sensing component stripes. In various embodiments, one sensing component stripe or one pair of sensing component stripes (e.g., coupling a source location and a destination location) can communicate with the shared I/O line at any given time. The shared I/O line is used to accomplish moving the data from one sensing component stripe to the other sensing component stripe.

A row can be selected (e.g., opened by the controller and/or subarray controller via an appropriate select line) for the first sensing component stripe and the data values of the memory cells in the row can be sensed. After sensing, the first sensing component stripe can be coupled to the shared I/O line, along with coupling the second sensing component stripe to the same shared I/O line. The second sensing component stripe can still be in a pre-charge state (e.g., ready to accept data). After the data from the first sensing component stripe has been moved (e.g., driven) into the second sensing component stripe, the second sensing component stripe can fire (e.g., latch) to store the data into respective sense amplifiers and compute components. A row coupled to the second sensing component stripe can be opened (e.g., after latching the data) and the data that resides in the sense amplifiers and compute components can be written into the destination location of that row.

FIG. 5 illustrates a timing diagram 533 associated with performing a number of data movement operations using circuitry in accordance with a number of embodiments of the present disclosure. The timing diagram 533 schematically illustrated in FIG. 5 is shown as an example of a sequence of operations associated with systolic movement of data, as described herein (e.g., sequential movement of data between adjacent subarrays 525-0, 525-1, 525-2, 525-3, and 525-4). A time scale (e.g., time points 1, 2, 3, 4, and 5) of arbitrary length (e.g., operational cycle and/or clock cycle) is horizontally demarcated and is shown by way of example.

At each time point, the functions described below can be performed substantially simultaneously in the subarrays executing the sequence of instructions (e.g., taking into account that a continuous length of a shared I/O line moves one data value (e.g., bit) at a time). For example, for a first subarray, input of data, processing of the data with operations, and moving the data to a next subarray, etc., can occur substantially simultaneously with the corresponding functions in a second subarray, a third subarray, and so on until the corresponding functions are performed in the last subarray of the sequence of instructions stored in the subarray controllers.

The sequence of instructions to be stored in and/or executed by the subarray controllers (e.g., subarray controllers corresponding to 170-0, 170-1, . . . , 170-N-1 described in connection with FIG. 1C) and performed as a sequence of operations is shown in FIG. 5 to be five different operations by way of example. However, embodiments of the present disclosure are not limited to a sequence of five operations, all the operations being different, and/or any or all of the operations being the particular operations shown in FIG. 5.

At time point 1, when a first batch of unprocessed data has been input into a first subarray 525-0, the first data values stored in some or all of the memory cells thereof can be processed by performance of an AND operation by a first subarray controller (e.g., subarray controller 170-0 described in connection with FIG. 1C) to produce a first set of data values. After such processing of the first set of data values, the first set of data values can be moved (e.g., transferred and/or copied) from a first sensing component stripe (e.g., sensing component stripe 124-0 described in connection with FIG. 1C) by being moved (e.g., transferred and/or transported) via a plurality of shared I/O lines 155, 355, and 455, as described in connection with FIGS. 1C, 3, 4A and 4B, respectively) for input to selected memory cells (e.g., some or all of the memory cells) of another (e.g., the second) subarray 525-1.

At time point 2 in subarray 525-1, the first set of data values stored in some or all of the memory cells in subarray 525-1 can be further processed by performance of an OR operation by a second subarray controller (e.g., subarray controller 170-2 described in connection with FIG. 1C). After such processing of the first set of data values, the first set of data values can be moved (e.g., transferred and/or copied) from a second sensing component stripe (e.g., sensing component stripe 124-1 described in connection with FIG. 1C) by being moved (e.g., transferred and/or transported) via the plurality of shared I/O lines for input to selected memory cells of a next (e.g., third) subarray 525-2. Substantially simultaneously with the input to selected memory cells (e.g., some or all of the memory cells) of the second subarray 525-1 at time point 2, a second batch of unprocessed data can be input into some or all of the memory cells of the first subarray 525-0 to be processed by performance of the AND operation to produce a second set of data values. After such processing of the second set of data values, the second set of data values can be moved (e.g., transferred and/or copied) from the first sensing component stripe (e.g., sensing component stripe 124-0 described in connection with FIG. 1C) by being moved (e.g., transferred and/or transported) via a plurality of shared I/O lines for input to selected memory cells (e.g., some or all of the memory cells) of the second subarray 525-1.

At time point 3 in third subarray 525-2, the first set of data values stored in some or all of the memory cells in subarray 525-2 can be further processed by performance of a NOR operation by a third subarray controller (e.g., subarray controller 170-2 described in connection with FIG. 1C). After such processing of the first set of data values, the first set of data values can be moved (e.g., transferred and/or copied) from a third sensing component stripe (e.g., sensing component stripe 124-2) by being moved (e.g., transferred and/or transported) via the plurality of shared I/O lines for input to selected memory cells of a next (e.g., fourth) subarray 525-3.

Substantially simultaneously with the input to selected memory cells (e.g., some or all of the memory cells) of the third subarray 525-2 at time point 3, a third batch of unprocessed data can be input into some or all of the memory cells of the first subarray 525-0 to be processed by performance of the AND operation to produce a third set of data values. After such processing of the third set of data values, the third set of data values can be moved (e.g., transferred and/or copied) from the first sensing component stripe (e.g., sensing component stripe 124-0) by being moved (e.g., transferred and/or transported) via the plurality of shared I/O lines for input to selected memory cells (e.g., some or all of the memory cells) of the second subarray 525-1.

Substantially simultaneously with the input of the first set of data values to selected memory cells (e.g., some or all of the memory cells) of the third subarray 525-2 and the input of the third set of data values to selected memory cells of the first subarray 525-0 at time point 3, the second batch of data values can be input to selected memory cells of the second subarray 525-1 to be processed by performance of the OR operation. After such processing of the second set of data values, the second set of data values can be moved (e.g., transferred and/or copied) from the second sensing component stripe (e.g., sensing component stripe 124-1) by being moved (e.g., transferred and/or transported) via the plurality of shared I/O lines for input to selected memory cells of the third subarray 525-2.

In the example shown in FIG. 5, the systolic data movement operation just described can continue through performance of a last operation of an operational cycle (e.g., an XOR operation) at time point 5. After the latency of five time points (e.g., five operational cycles and/or clock cycles) for the five operations to be completed in the operation sequence, a completely processed batch of data can be output at each time point thereafter until the last batch of unprocessed data input to the first subarray 525-0 has been completely processed.

From the last (e.g., fifth) subarray 525-4 in the operation sequence, the completely processed data values of each batch can be output (e.g., as shown at 141 and described in connection with FIG. 1B) to, in some embodiments, a cache 571-2 associated with the controller 540. The controller 540 shown in FIG. 5 can, in various examples, represent at least a portion of the functionality embodied by and contained in the controller 140 shown in FIGS. 1A-1C. The controller 540 can be configured to output each batch of the completely processed data values from the cache 571-2 to the host 110 via, for example, an HSI out-of-band bus 157 (e.g., as described in connection with FIG. 1A).

Accordingly, embodiments described herein provide a method for operating a memory device to implement data movement (e.g., systolic data movement, as described herein) performed by execution of non-transitory instructions by a processing resource. As described herein, the method can include performing a first operation on data values stored by memory cells in a particular row in a first subarray by execution of a first set of instructions, where the first set of instructions can be in a first subarray controller for the first subarray. The method can include moving the data values, upon which the first operation has been performed, to a selected row of memory cells in a second subarray using a first sensing component stripe for the first subarray. The method can include performing a second operation on the data values moved to the selected row of the second subarray by execution of a second set of instructions, where the second set of instructions can be in a second subarray controller for the second subarray.

For example, in some embodiments, the first set of instructions can be stored in the first subarray controller, where the first subarray controller is coupled to the first subarray, and the second set of instructions can be stored in the second subarray controller, where the second subarray controller is coupled to the second subarray. Alternatively and/or in addition, the first and second sets of instructions can be accessed by (e.g., without being stored by) the first subarray controller and the second subarray controller, respectively, from, for example, the controller 140 to be executed for performance of particular operations. As such, the method can include the controller directing performance of the first operation with respect to data stored in the first subarray by execution of the first set of instructions and directing performance of the second operation with respect to data stored in the second subarray by execution of the second set of instructions.

As described herein, the method can include coupling the first sense amplifier stripe (e.g., 124-0) for the first subarray (e.g., 125-0) via a shared I/O line (e.g., 455-1, 455-2, . . . , 455-M) to the selected row (e.g., 319) of memory cells in the second subarray (e.g., 125-1). The data values can be moved (e.g., transferred and/or transported) from the particular row in the first subarray, upon which the first operation has been performed, via the shared I/O line to the selected row of memory cells in the second subarray using the coupled first sense amplifier stripe. The data values from the particular row in the first subarray can be processed by performance of the first operation as directed by execution of instructions by the first subarray controller for the first subarray and the data values can be processed (e.g., systolically processed) by performance of the second operation in the selected row of the second subarray as directed by execution of instructions by a second subarray controller for the second subarray. The method can, in various embodiments, include coupling only one of a plurality of (e.g., eight) columns (e.g., columns of complementary sense lines 305-1 and 305-2) at a time in the first subarray to each one of the plurality of shared I/O lines using the first sensing component stripe.

A controller (e.g., 140) can be coupled to the subarray controllers for the first and second subarrays. The controller can provide (e.g., input) the first set of instructions to the subarray controller for the first subarray to direct performance of the first operation by the first sensing component stripe. The controller also can provide (e.g., input) the second set of instructions to the subarray controller for the second subarray to direct performance of the second operation by the second sensing component stripe. The method can include the controller selecting a first row of memory cells in the first subarray for the first sensing component stripe to sense data stored therein, coupling the plurality of shared I/O lines to the first sensing component stripe, coupling the selected row of memory cells in the second subarray to the plurality of shared I/O lines, and moving the data in parallel from the first sensing component stripe to the selected row of memory cells in the second subarray via the plurality of shared I/O lines. The first sensing component stripe can store (e.g., cache) the data values upon which the first operation has been performed and the moved data values can be stored (e.g., cached and/or saved) in the selected row of memory cells in the second subarray.

As described in connection with FIG. 5, the method can include performing substantially simultaneously each operation of a sequence of operations by execution of a first set of instructions by a first subarray controller coupled to the first subarray and by execution of a second set of instructions by the second subarray controller coupled to the second subarray. The sequence of operations can be performed (e.g., substantially simultaneously performing at least two operations) after data is present for processing in the particular row in the first subarray and the selected row of memory cells in the second subarray. In various embodiments, performance of the first operation by execution of instructions by the first subarray controller can be configured to be an operation that is different than a second operation performed by execution of instructions by the second subarray controller. However, when appropriate for the sequence of instructions to be executed in the first and second subarrays, the first and second subarray controllers can be configured to perform the same operation.

While example embodiments including various combinations and configurations of sensing circuitry, sense amplifiers, compute components, sensing component stripes, subarray controllers, shared I/O lines, column select circuitry, multiplexers, timing sequences, etc., have been illustrated and described herein, embodiments of the present disclosure are not limited to those combinations explicitly recited herein. Other combinations and configurations of the sensing circuitry, sense amplifiers, compute components, sensing component stripes, subarray controllers, shared I/O lines, column select circuitry, multiplexers, timing sequences, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a first subarray controller coupled to a first subarray of memory cells, the first subarray controller configured to execute a first set of instructions to direct performance of a first operation using first sensing circuitry coupled to the first subarray; and
   a second subarray controller coupled to a second subarray of memory cells, the second subarray controller configured to independently execute a second set of instructions to direct performance of a second operation using second sensing circuitry coupled to the second subarray; wherein:
   the first and second sensing circuitry are each configured to operate as an in-memory processor for the respective memory cells; and
   a data value corresponding to a result of the first operation is moved from the first subarray to the second subarray.

2. The apparatus of claim 1, wherein the sensing circuitry is configured to implement movement of a data value stored in the first subarray, upon which the first operation has been performed, to a memory cell in the second subarray.

3. The apparatus of claim 1, wherein the apparatus further comprises an I/O line shared by the sensing circuitry of the first and second subarrays to selectably implement movement of a data value stored in the first subarray, upon which the first operation has been performed, to the second subarray.

4. The apparatus of claim 1, wherein the apparatus further comprises a plurality of I/O lines shared by the sensing circuitry of the first and second subarrays to selectably implement parallel movement of a plurality of data values stored in the first subarray, upon which the first operation has been performed, to a plurality of memory cells in the second subarray.

5. The apparatus of claim 1, wherein the apparatus further comprises:
   a sensing component stripe configured to include a quantity of sense amplifiers and compute components of the sensing circuitry that corresponds to a quantity of columns of the memory cells;
   wherein the quantity of sense amplifiers and compute components is selectably coupled to a plurality of I/O lines shared by the sensing circuitry of each of a plurality of subarrays.

6. The apparatus of claim 1, wherein:
   the sensing circuitry comprises a quantity of sensing component stripes; and
   the quantity of the sensing component stripes corresponds to a quantity of subarrays.

7. The apparatus of claim 1, wherein the apparatus further comprises column select circuitry to selectably sense data in a particular column of memory cells of a subarray by being selectably coupled to at least one of a sense amplifier and a compute component coupled to a respective sense line of a particular column.

8. The apparatus of claim 1, wherein the apparatus further comprises:
   a sensing component stripe including a number of sense amplifiers and compute components of the sensing circuitry configured to move a quantity of data sensed from a row of the first subarray in parallel to a quantity of I/O lines;
   wherein the quantity of data corresponds to the quantity of I/O lines.

9. An apparatus, comprising:
   a first subarray controller coupled to a first subarray of memory cells, the first subarray controller configured to execute a first set of instructions to direct performance of a first operation in a sequence of operations by a first number of in-memory processors on data stored in the first subarray; and
   a second subarray controller coupled to a second subarray of memory cells, the second subarray controller configured to independently execute a second set of instructions to direct performance of a second operation in the sequence by a second number of in-memory processors on data stored in the second subarray; and
   a controller configured to provide a different set of instructions for the first operation and the second operation to the respective first subarray controller and second subarray controller.

10. The apparatus of claim 9, wherein the first and second subarrays are subarrays of random access memory (RAM) cells.

11. The apparatus of claim 9, wherein the controller is further configured to:
    determine, based upon input of data, which of a plurality of sequences of operations stored by the first and second subarray controllers is appropriate for processing of the data; and
    provide the data to a particular subarray based upon a particular subarray controller coupled to the particular subarray being configured to perform a first operation in an appropriate stored sequence of operations.

12. The apparatus of claim 9, wherein the apparatus further comprises:
    connection circuitry configured to connect sensing circuitry coupled to a particular column in the first subarray to a number of rows in a corresponding column in the second subarray; wherein:

the connection circuitry is configured to move a data value to a selected row and the corresponding column in the second subarray for execution of a next operation in the sequence of operations; and the movement of the data value is directed by a subarray controller of the first subarray executing a set of instructions when the data value is stored in the sensing circuitry.

13. A system, comprising:
a host configured to generate instructions for movement of data; and
a controller of a memory device, the controller configured to execute the instructions from the host for the movement of data, wherein the memory device comprises:
a first subarray controller coupled to a first subarray of memory cells, the first subarray controller configured to execute a first set of the instructions to direct performance of a first operation; and
a second subarray controller coupled to a second subarray, the second subarray controller configured to independently execute a second set of the instructions to direct performance of a second operation;
wherein the first and second subarray controllers are each configured to receive from the controller an instruction from the respective sets of instructions that directs performance of a sequence of operations on data stored in the respective subarray by sensing circuitry coupled to the respective subarray.

14. The system of claim 13, wherein the instructions received from the host comprise a quantity of sets of instructions to execute performance of different sequences of operations stored by subarray controllers for a corresponding quantity of subsets of subarrays.

15. The system of claim 13, wherein:
the host is further configured to direct the controller to:
provide data to a particular subarray based upon a particular subarray controller coupled to the particular subarray being configured to perform a first operation in an appropriate stored sequence of operations;
wherein the particular subarray controller coupled to the particular subarray is an initial location for execution of the first set of the instructions to direct performance of the first operation in the appropriate stored sequence of operations.

16. The system of claim 13, wherein the host is further configured to provide the instructions to the controller for the controller to execute a command for systolic movement of the data.

17. The system of claim 13, wherein a particular subarray that is an initial location for the movement of data has at least one stored sequence of operations for a plurality of subarrays.

18. The system of claim 13, wherein performance of a stored sequence of a number of operations is configured to yield output at a destination location in the subarrays.

19. The system of claim 13, wherein the system further comprises:
a cache associated with the controller, the cache configured to:
receive data from the host; and
signal to the controller that the data is received to initiate performance of a stored sequence of a plurality of operations.

20. The system of claim 13, wherein the system further comprises:
a cache associated with the controller, the cache configured to:
receive output of completed execution of the sequence of operations from a destination location in the subarrays; and
signal to the controller to initiate another iteration of performance of the sequence of operations by input of new data, received from the host, to selected memory cells in a subarray at an initial location.

* * * * *